US009689556B2

(12) United States Patent
Pan et al.

(10) Patent No.: US 9,689,556 B2
(45) Date of Patent: Jun. 27, 2017

(54) DOWN CONVERSION ARRAY COMPRISING QUANTUM DOTS

(75) Inventors: Junyou Pan, Frankfurt am Main (DE); Niels Schulte, Kelkheim (DE); Thomas Eberle, Landau (DE)

(73) Assignee: Merck Patent GmbH, Darmstadt (DE)

( * ) Notice: Subject to any disclaimer, the term of this patent is extended or adjusted under 35 U.S.C. 154(b) by 24 days.

(21) Appl. No.: 13/699,827

(22) PCT Filed: Apr. 28, 2011

(86) PCT No.: PCT/EP2011/002126
§ 371 (c)(1),
(2), (4) Date: Nov. 26, 2012

(87) PCT Pub. No.: WO2011/147521
PCT Pub. Date: Dec. 1, 2011

(65) Prior Publication Data
US 2013/0070443 A1    Mar. 21, 2013

(30) Foreign Application Priority Data

May 27, 2010  (EP) .................................... 10005489

(51) Int. Cl.
| *H01L 51/54* | (2006.01) |
| *F21V 9/16* | (2006.01) |
| *C09K 9/02* | (2006.01) |
| *C09K 11/06* | (2006.01) |
| *C09K 11/88* | (2006.01) |
| *H01L 27/32* | (2006.01) |
| *H01L 33/50* | (2010.01) |
| *H05B 33/14* | (2006.01) |
| *C09K 11/56* | (2006.01) |
| *H01L 51/00* | (2006.01) |
| *B82Y 30/00* | (2011.01) |
| *B82Y 20/00* | (2011.01) |
| *H01L 51/50* | (2006.01) |
| *H01L 51/52* | (2006.01) |

(52) U.S. Cl.
CPC ................. *F21V 9/16* (2013.01); *C09K 9/02* (2013.01); *C09K 11/06* (2013.01); *C09K 11/565* (2013.01); *C09K 11/88* (2013.01); *C09K 11/883* (2013.01); *H01L 27/322* (2013.01); *H01L 33/502* (2013.01); *H01L 51/0034* (2013.01); *H01L 51/0035* (2013.01); *H05B 33/14* (2013.01); *B82Y 20/00* (2013.01); *B82Y 30/00* (2013.01); *C09K 2211/14* (2013.01); *H01L 51/5012* (2013.01); *H01L 51/5016* (2013.01); *H01L 51/5262* (2013.01); *H01L 2251/5361* (2013.01); *H01L 2251/5369* (2013.01); *Y02B 20/181* (2013.01); *Y10S 977/774* (2013.01); *Y10S 977/783* (2013.01); *Y10S 977/932* (2013.01); *Y10S 977/95* (2013.01); *Y10T 428/21* (2015.01)

(58) Field of Classification Search
CPC .. F21V 9/16; C09K 11/88; C09K 9/02; C09K 11/06; C09K 11/883; C09K 2211/14; H05B 33/14; H01L 27/322; H01L 2251/5369; H01L 2251/5361; Y10T 428/21; Y10S 977/932; B82Y 30/00; Y02B 20/181
USPC .................................................. 313/498–512
See application file for complete search history.

(56) References Cited

U.S. PATENT DOCUMENTS

| 6,322,901 | B1 * | 11/2001 | Bawendi et al. | 428/548 |
| 6,608,439 | B1 | 8/2003 | Sokolik et al. | |
| 6,864,626 | B1 * | 3/2005 | Weiss et al. | 313/503 |
| 7,332,211 | B1 * | 2/2008 | Bulovic et al. | 428/206 |
| 7,495,383 | B2 * | 2/2009 | Chua et al. | 313/503 |
| 7,645,397 | B2 * | 1/2010 | Parce et al. | 252/301.36 |
| 7,829,772 | B2 * | 11/2010 | Sun | 424/489 |
| 8,004,186 | B2 * | 8/2011 | Kim et al. | 313/506 |
| 8,040,045 | B2 | 10/2011 | Bechtel et al. | |
| 8,080,437 | B2 * | 12/2011 | Steckel et al. | 438/46 |
| 8,785,906 | B2 * | 7/2014 | Miller et al. | 257/14 |
| 9,099,655 | B2 * | 8/2015 | Pan | H01L 51/004 |
| 2003/0057821 | A1 * | 3/2003 | Fink et al. | 313/461 |
| 2005/0006656 | A1 * | 1/2005 | Jain et al. | 257/88 |
| 2006/0043361 | A1 * | 3/2006 | Lee et al. | 257/40 |
| 2006/0081862 | A1 | 4/2006 | Chua et al. | |
| 2006/0099449 | A1 | 5/2006 | Amano et al. | |
| 2007/0024175 | A1 * | 2/2007 | Chua et al. | 313/486 |
| 2007/0159061 | A1 * | 7/2007 | Krummacher | B82Y 20/00 313/501 |
| 2007/0187580 | A1 * | 8/2007 | Kykta et al. | 250/227.15 |
| 2008/0093980 | A1 | 4/2008 | Stoessel et al. | |
| 2008/0105887 | A1 | 5/2008 | Narendran et al. | |

(Continued)

FOREIGN PATENT DOCUMENTS

| JP | 2004071357 A | 3/2004 |
| JP | 2006114900 A | 4/2006 |

(Continued)

OTHER PUBLICATIONS

Park, Jong Hyeok, et al., "White Emission from Polymer/Quantum Dot Ternary Nanocomposites by Incomplete Energy Transfer", Nanotechnology, vol. 15, (2004), pp. 1217-1220.

(Continued)

*Primary Examiner* — Donald Raleigh

(57) ABSTRACT

The present invention relates inter alia to an array comprising i times j array elements, wherein the array elements may comprise at least one quantum dot and/or at least one photoluminescent compound. Further the present invention relates to devices comprising these arrays. The arrays and devices can be used to generate white light with high color purity.

18 Claims, 6 Drawing Sheets

(56) References Cited

U.S. PATENT DOCUMENTS

| | | | |
|---|---|---|---|
| 2008/0203895 A1* | 8/2008 | Miller et al. | 313/498 |
| 2008/0278063 A1* | 11/2008 | Cok | 313/500 |
| 2008/0296555 A1* | 12/2008 | Miller | C09K 11/025 257/14 |
| 2008/0302977 A1 | 12/2008 | Yao et al. | |
| 2009/0039764 A1* | 2/2009 | Cho et al. | 313/504 |
| 2009/0212695 A1* | 8/2009 | Kim | H01L 51/5036 313/506 |
| 2010/0001256 A1* | 1/2010 | Coe-Sullivan et al. | 257/13 |
| 2010/0026703 A1* | 2/2010 | Parker | G02B 6/0046 345/589 |
| 2010/0258789 A1* | 10/2010 | Akai | C09K 11/025 257/40 |
| 2010/0283036 A1* | 11/2010 | Coe-Sullivan et al. | 257/13 |
| 2010/0295464 A1 | 11/2010 | Kasakura et al. | |
| 2011/0025951 A1* | 2/2011 | Jones | 349/70 |
| 2011/0156575 A1* | 6/2011 | Yu et al. | 313/503 |
| 2012/0056170 A1* | 3/2012 | Pan | H01L 51/004 257/40 |

FOREIGN PATENT DOCUMENTS

| | | | |
|---|---|---|---|
| JP | 2006135225 A | 5/2006 | |
| JP | 2007049140 A | 2/2007 | |
| JP | 2008/506657 A | 3/2008 | |
| JP | WO2009/041594 * | 9/2008 | ............. H01L 51/50 |
| JP | 2008544553 A | 12/2008 | |
| JP | 2009501417 A | 1/2009 | |
| JP | 2009238729 A | 10/2009 | |
| JP | 2009265634 A | 11/2009 | |
| WO | WO-2008/103876 A1 | 8/2008 | |
| WO | WO-2009014707 A2 | 1/2009 | |

OTHER PUBLICATIONS

International Search Report for PCT/EP2011/002126 mailed Aug. 19, 2011.

* cited by examiner a) $A_{10\ 10}$ b) $A_{6\ 1}$ c) $A_{5\ 8}$ a)

$\Lambda_{41} = [A_{11}, A_{15}, A_{12}, A_{11}]$ b)

$\Lambda_{22}$

DOWN CONVERSION ARRAY COMPRISING QUANTUM DOTS

RELATED APPLICATIONS

This application is a national stage application (under 35 U.S.C. §371) of PCT/EP2011/002126, filed Apr. 28, 2011, which claims benefit of European Application No. 10005489.9, filed May 27, 2010. Both are incorporated herein by reference in their entirety.

The present invention relates inter alia to an array comprising i times j array elements, wherein the array elements may comprise at least one quantum dot and/or at least one photoluminescent compound. Further the present invention relates to devices comprising these arrays. The arrays and devices can be used to generate white light with high color purity by down conversion. The present invention also relates to compositions comprising at least 2 quantum dots and at least one photoluminescent compound.

For lighting applications, a high quality white light source is desired. Due to its low efficiency and low lifetime, incandescent light bulbs are phasing out. Actually, Governments have passed measures to prohibit the sale of incandescent light bulbs. Alternative technologies should be developed. Among the different ways, solid-state lighting (SSL) is the most promising one, especially for those based on light emitting diodes (LED), mainly because the LED technology is getting mature, which gives both high efficiency and long lifetime. The typical approaches for such a solid-state light source are for example: Blue or ultraviolet (UV) light source with a color conversion medium, RGB three color white source, and blue-yellow two color white source. For those approaches, LED, organic light emitting diodes (OLED) and quantum dot (QD) OLEDs or a combination thereof can be used. The most widely used white light LED technology utilizes a cerium doped YAG:Ce (Yttrium Aluminum Garnet:Cerium) down conversion phosphor pumped by a blue LED chip emitting light at a wavelength of e.g. about 450 nm. The combination of blue light from the LED and a broad Yellow emission from the YAG phosphor results in white light. This white light often appears somewhat blue, giving a Color Rendering Index (CRI) of 70 to 80.

However, light sources having a high CRI, i.e. higher than 85 or even higher than 90, are desirable in general lighting, and as backlight for display having richer color space. For some other special applications such as photography and cinematography, a white source with even higher CRI is required. Further, for scientific research, a light source emitting light of a quality near light emitted from a black body and having a specific color temperature is desired.

Theoretically, the optimal white light source is the so called black body. Except for an incandescent bulb, no man-made white light source results in a light having a quality comparable to light emitted from a black body. However, incandescent bulb has a low color temperature just about 3200° C., whereas sunlight has 6500° C. In addition, using incandescent bulb and/or sunlight for lighting applications results in spectra including UV parts and IR parts, which are useless and/or undesired for the human eye. And therefore represent a loss of energy. Therefore, a desired lighting source has a limited spectrum for which the human eye is sensitive.

From technical point of view, the phosphor materials, after several decades of development, are already very mature, highly efficient, robust and versatile; form economic point of view, the phosphor materials are also very cheap and thus very competitive. However, the CRI is low when only phosphor materials are employed as down converter which results in a white color with low quality.

Therefore, it is highly desired to get a white of high quality, e.g. with high CRI, by improving the existing systems. Objective of the present invention is therefore to provide compositions and arrays comprising the compositions in order to get white light with high quality, i.e. white light with a high CRI.

Surprisingly it has been found that quantum dots can be used in connection with photoluminescent compounds in order to get white light with a very high CRI. Quantum dots can easily be produced and have a narrow emission spectrum in contrast to organic fluorescent or phosphorescent compounds. They can be tailored in terms of size which determines the quantum dot's emission maximum. High photoluminescent efficiency can also be obtained with quantum dots. Furthermore their emission intensity can be tailored by their concentration employed. Moreover, quantum dots are soluble in many solvents or can easily be made soluble in common organic solvents, allowing versatile processing methods, particularly printing methods such as screen printing, off-set printing, and ink jet printing.

The present invention relates to an array $A_{ij}$ comprising i times j array elements characterized in that the array $A_{ij}$ comprises at least one composition comprising at least one quantum dot being localized in one or more of the array elements $a_{ij}$ and wherein i is a row index and j is a column index being larger than 0 with the provisio that if i=j=1 the composition of array element $a_{11}$ comprises at least two quantum dots and at least one photoluminescent compound.

The array $A_{ij}$ of the present invention can be regarded as matrix. An array $A_{77}$, for instance, has 49 array elements $a_{ij}$ with both the row index i and the column index j ranging from 1 to 7.

The array is further characterized in that the compositions comprising the quantum dot(s) and/or photoluminescent compound(s) are located in the array elements. The space in between the array elements is called gap. The width of the gap can take any width depending on the array elements. Preference is given to a width of the gap of less than 2 mm, particularly preferably it is less than 1 mm and very particularly preferably less than 0.5 mm. The gap can be transparent for the light of the light source or opaque. The gap can also comprise a color converter in order to down-convert, e.g., UV light of a light source, particularly to blue light.

The array $A_{ij}$ comprises preferably less than 50, particularly less than 35, and very particularly preferably less than 20 different compositions. Particular preference is given to an array $A_{ij}$ comprising less than 10 different compositions.

The different compositions can be arranged statistically in the array $A_{ij}$. Preferably the compositions are arranged periodically, as exemplary outlined in FIG. 6a), where 9 different compositions are employed in an $A_{10\ 10}$ array.

The rows and/or columns may also be displaced to each other, as outlined in FIG. 6c). Here an array $A_{5\ 8}$ is shown with hexagonal array elements where the rows are displaced to each other.

The array, if either i>1 or j>1, may comprise within its array elements compositions comprising quantum dots without any further photoluminescent compounds. In this case at least two different compositions comprising different quantum dots are used. The separation of quantum dots leads to a reduction of energy loss through re-absorption of light emitted by another quantum dots. Re-absorption occurs when the emission spectrum of one quantum dot overlaps significantly with the absorption spectrum of another quantum dot. In one preferred embodiment the array elements comprise a composition comprising only one type of quantum dots. In one further preferred embodiment the array comprises a composition comprising at least two different types of quantum dots, characterized in that the quantum dots are miscible, as defined above.

If the compositions of one array comprises at least one additional photoluminescent compound, the same argumentation applies mutatis mutandis with respect to energy loss through re-absorption. Preference is given to array elements comprising a composition comprising at least one quantum dot and at least one photoluminescent compound, characterized in that the components are do not show significant re-absorption.

The array elements according to the present invention thus comprise preferably quantum dots and/or photoluminescent compounds that do not show significant re-absorption. Significant re-absorption is given when the re-absorption rate is at least 5%, preferably at least 10%, particularly preferably at least 20%, and very particularly preferably at least 30%. A re-absorption rate of, e.g., 5% means that 5% of radiation emitted by the composition of an array element is re-absorbed by one of its components.

The arrays can be used to produce white light with very high color purity. This can be achieved by, e.g., irradiating the array with light from a blue or UV light source. The components of the array absorb, at least in part, the light from the light source. The array according to the present invention is tailored to have a broadband spectrum.

The separation of different quantum dots, of different photoluminescent compounds, and of photoluminescent compounds and quantum dots can be very beneficial for the generation of white light. This is, as outlined above, due to the fact that light emitted by one component of the composition can be re-absorbed by another component if all components are located in a single composition. This may lead to a loss of energy which makes the process energetically inefficient.

More than one of the arrays according to the present invention can be taken to get a larger panel of repeating arrays. The present invention also relates to an array of arrays according to the present invention, which is called super-array $\Lambda_{nm}$ or block matrix, wherein n and m are the row and column indices being integers larger or equal to 1. If one of n or m is 1 the other index is lager than 1. The super array comprises, thus, n times m array elements $\lambda_{nm}$, wherein the array elements is $A_{ij}$. Hereby different or identical arrays according to the present invention can be used on a substrate in order to get any kind of super-array. As an example, the arrays $A_{11}, A_{15}, A_{12}$, and $A_{11}$ can be used to get the super-array $\Lambda_{41}=[A_{11}, A_{15}, A_{12}, A_{11}]$. The arrays elements of the super array may have the same or different size on the substrate, which is illustrated for this specific case in FIG. 7a). As also shown in FIG. 7a) the size of the array elements can vary. FIG. 7b) depicts an example of a super-array $\Lambda_{22}$, wherein $\lambda_{11}=A_{11}, \lambda_{12}=A_{12}, \lambda_{21}=A_{33}$, and $\lambda_{22}=A_{21}$.

The array elements of the arrays according to the present invention preferably comprise the quantum dot(s), if present, in each a concentration of at least 0.1 wt %, particularly preferably at least 0.5 wt %, and very particularly preferably of at least 3 wt % with respect to the total amount of the composition of the array element.

The arrays and/or super-arrays according to the present invention can take any size which is suitable for the specific application. The size of the array elements preferably varies between 1 μm and 5 mm, particularly preferably between 5 μm and 3 mm, and very particularly preferably between 10 μm and 2 mm.

An array according to the present invention comprising compositions comprising at least one further photoluminescent compound is therefore also subject of the present invention.

The array elements of the arrays according to the present invention preferably comprise the photoluminescent compound(s), if present, each in a concentration of at least 0.1 wt %, particularly preferably at least 0.5 wt %, and very particularly preferably of at least 3 wt % with respect to the total amount of the composition of the array element.

Preference is given to an $A_{11}$ array comprising at least 3 quantum dots and at least one photoluminescent compound, particularly preferably at least 4 quantum dots and at least one photoluminescent compound, and very particularly preferably at least 5 quantum dots and at least one photoluminescent compound. Particularly preferably the $A_{11}$ array comprises 5 quantum dots and 2 photoluminescent compounds. Further preference is given to an $A_{11}$ array comprising 7 different quantum dots and one photoluminescent compound. Further particular preference is given to an $A_{11}$ array comprising 8 different quantum dots and one photoluminescent compound.

The shape of the array elements can be selected from any shape, preferably from a square, circular, oval, triangular, hexagonal, polygonal and irregular curved shape. Preferably the shape of the array element is square or rectangular and square. An example of array elements with hexagonal shape is shown in FIG. 6c).

The array elements $a_{ij}$ of the array $A_{ij}$ may all comprise a composition of at least one quantum dot and/or at least one photoluminescent compound or a combination thereof. In a preferred embodiment the array $A_{ij}$ comprises less than 30%, particularly preferably 20% and very particularly preferably 10% array elements $a_{ij}$ which do not comprise any of the aforementioned compositions. These array elements $a_{ij}$ may be transparent for light or opaque. If the array element is transparent for light, the blue light of the light source can be used for the generation of white light. FIG. 6c) illustrates an $A_{5\,8}$ array with hexagonal array elements where 20% of the array elements are transparent for light of the light source.

In a preferred embodiment the array according to the present invention comprises at least two quantum dots. Particularly preferably the array comprises at least 3 and very particularly preferably at least 4 different quantum dots. The arrays according to the present invention can comprise an unlimited number of different quantum dots. Preferably the said array comprises less than 100, particularly preferably less than 70 and very particularly preferably less than 40 different quantum dots. In a further preferred embodiment the said array comprises less than 20 different types of quantum dots.

Preference is given to said arrays, characterized in that the quantum dots have emission intensity maxima in the range between 380 and 700 nm. Further preference is given to said arrays wherein the emission intensities of the different types of quantum dots have the same full width at half maximum (FWHM). Further preference is given to said arrays wherein the emission intensities of the different types of quantum dots have different FWHMs.

Preferably the quantum dots used in the array according to the present invention differ in their emission intensity maxima. Preferably the emission intensity maxima differ for at least 5 nm, particularly preferably they differ for at least 10 nm.

In general, a quantum dot is a semiconductor whose excitons are confined in all three spatial dimensions. As a result, they have properties that are between those of bulk semiconductors and those of discrete molecules. There are several ways to prepare quantum dot structures, for example by chemical methods or by ion implantation, or in nanodevices made by state-of-the-art lithographic techniques.

The quantum dots of the present invention refer to colloidal semiconductor nanocrystals, also known as colloidal quantum dots, or nanodots or nanocrystals, which are produced by chemical methods.

The first mono-dispersive colloidal quantum dots including a semiconducting material were based on CdE (E=S, Se, Te) and were produced using the so called TOPO (trioctyl phosphine oxide) method by Bawendi and later modified by Katari et al. A review on synthesis of QDs is given by Murray, Norris and Bawendi, "Synthesis and characterization of nearly monodisperse CdE (E=sulfur, selen, tellurium) semiconductor nanocrystallites", J. Am. Chem. Soc. 115 [19], 8706-8715, 1993.

While any method known to the skilled person can be used to create QDs, preferably a solution-phase colloidal method for controlled growth of inorganic QDs is used. The said colloidal methods are disclosed, e.g., by Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J. Am. Chem. Soc. 115:8706 (1993). These methods allow low cost processability without the need for clean rooms and expensive manufacturing equipment. In these methods, metal precursors that undergo pyrolysis at high temperature are rapidly injected into a hot solution of organic surfactant molecules. These precursors break apart at high temperatures and react to nucleate nanocrystals. After this initial nucleation phase, a growth phase begins by the addition of monomers to the growing crystal. Thus, crystalline nanoparticles are obtained in solution that has an organic surfactant molecule coating their surface.

In these methods, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape. The ratio of surfactants to monomer, surfactants to each other, monomers to each other, and the individual concentrations of monomers strongly influence the kinetics of growth.

The suitable semiconducting materials, which can be incorporated into QDs, are selected from elements of Group II-VI, such as CdSe, CdS, CdTe, ZnSe, ZnO, ZnS, ZnTe, HgS, HgSe, HgTe and alloys thereof such as CdZnSe; Group III-V, such as InAs, InP, GaAs, GaP, InN, GaN, InSb, GaSb, AlP, AlAs, AlSb and alloys such as InAsP, CdSeTe, ZnCdSe, InGaAs; Group IV-VI, such as PbSe, PbTe and PbS and alloys thereof; Group III-VI, such as InSe, InTe, InS, GaSe and alloys such as InGaSe, InSeS; Group IV semiconductors, such as Si and Ge alloys thereof, and combinations thereof in composite structures.

Further suitable semiconductor materials include those disclosed in U.S. patent application Ser. No. 10/796,832 and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlS, AlSb, BaS, BaSe, BaTe, CaS, CaSe, CaTe, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such semiconductors.

Preferably the quantum dot is selected from Group II-VI, Group III-V, Group IV-VI and Group IV semiconductors, particularly preferably from ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, and a combination thereof.

In some embodiments, the QDs may comprise a dopant from the group consisting of: a p-type dopant or an n-type dopant. The properties and synthesis of a doped QD can be referred to "n-type colloidal semiconductor nanocrystals" by Moonsub Shim & Philippe Guyot-Sionnest, Nature vol 407 (2000) p 981, and "Doped Nanocrystals" by Norris et al., Science, 319 (2008), p 1776. The QDs the present invention can also comprise II-VI or III-V semiconductors. Examples of II-VI or III-V semiconductor nanocrystals include any combination of an element from Group II, such as Zn, Cd and Hg, with any element from Group VI, such as S, Se, Te, Po, of the Periodic Table; and any combination of an element from Group III, such as B, Al, Ga, In, and Tl, with any element from Group V, such as N, P, As, Sb and Bi, of the Periodic Table.

In quantum dots, photoluminescence and electroluminescence arise from the band edge states of the nanocrystal. The radiative band-edge emission from nanocrystals competes with non-radiative decay channel originating from surface electronic states, as reported by X. Peng, et al., J. Am. Chem. Soc. Vol 119:7019-7029 (1997). Thus, the presence of surface defects such as dangling bonds provides non-radiative recombination centers and lower emission efficiency. An efficient method to passivate and remove the surface trap states is to epitaxially grow an inorganic shell material on the surface of the nanocrystal, as disclosed by X. Peng, et al., J. Am. Chem. Soc. Vol 119:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favour the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials. Additionally, the spherical shape acts to minimize interfacial strain energy from the large radius of curvature, thereby preventing the formation of dislocations that could degrade the optical properties of the nanocrystal system.

In a preferred embodiment, ZnS can be used as the shell material using synthetic processes well known to one skilled in the art.

In a particularly preferred embodiment, the QD of the invention comprises semiconducting materials selected from Group II-VI semiconductors, alloys thereof and core/shell structures made there from. In further embodiments, the Group II-VI semiconductors are CdSe, CdS, CdTe, ZnSe, ZnS, ZnTe, alloys thereof, combinations thereof and core/shell, core multi-shell layered-structures thereof.

In some embodiments, the QDs of the present invention comprise further ligands conjugated, cooperated, associated or attached to their surface. Suitable ligands include any group known to those skilled in the art, including those disclosed in U.S. Ser. No. 10/656,910 and U.S. 60/578,236. Use of such ligands can enhance the ability of the QDs to incorporate into various solvents and matrix materials, including polymers. Further preferred ligands are such having a "head-body-tail" structure, as disclosed in US 2007/0034833A1, wherein further preferably the "body" has an electron or hole transport function, as disclosed in US 20050109989A1.

The term quantum dot refers to nanocrystals that are substantially mono-disperive in size. A QD has at least one region or characteristic dimension with a dimension of less than about 500 nm, and down to on the order of less than about 1 nm. The term mono-dispersive means the size distribution is within +−10% of the stated value, for example a mono-dispersive nanocrystals of 100 nm in diameter encompasses a range of sizes from 90 nm or larger to 110 nm or smaller.

Due to the finite size of the QDs, in particular core-shell QDs, they display unique optical properties compared to their bulk counterparts. The emission spectrum is defined by a single Gaussian peak, which arises from the band-edge luminescence. The emission peak location is determined by the core particle size as a direct result of quantum confinement effects. The electronic & optical properties are discussed by Al. L. Efros and M. Rosen in Annu. Rev. Mater. Sci. 2000. 30:475-521. Furthermore, the intensity of emission can be tailored according to the concentration used in the array element and/or composition.

The array according to the present invention comprises at least one photoluminescent compound. A photoluminescent compound is any compound which emits light after having absorbed light of a different wavelength. Preferably the photoluminescent compound(s) are selected from fluorescent materials. Further preference is given to photoluminescent compounds which are selected from phosphorescent material.

The said array comprises preferably 3, particularly preferably 2 and very particularly preferably 1 photoluminescent compound. The photoluminescent compounds are located in the array elements of the array, either alone or as mixture together with other photoluminescent compounds and/or quantum dots or further materials.

The photoluminescent compounds according to the present invention can be organic compounds or inorganic compounds. The photoluminescent compounds according to the present invention can be selected from small molecules, polymers, oligomers, dendrimers, and blends thereof.

The term small molecule as used herein is defined as molecule not being a polymer, oligomer, dendrimer, or a blend. In particular, repeating structures are absent in small molecules. The molecular weight of small molecules is typically in the range of polymers with a low number of repeating units, oligomers or less. The molecular weight of the small molecule may be preferably below 4000 g/mol, particularly preferably below 3000 g/mol, and very particularly preferably below 2000 g/mol.

The polymers of embodiments preferably may have 10 to 10000, particularly preferably 20 to 5000 and very particularly preferably 50 to 2000 repeating units. Oligomers according to embodiments may have 2 to 9 repeating units. The branching index of the polymers and oligomers is between 0 (linear polymer without branching) and 1 (completely branched dendrimer). The term dendrimer as used herein is defined according to M. Fischer et al. in Angew. Chem., Int. Ed. 1999, 38, 885.

The molecular weight (MW) of the polymers of embodiments may preferably be in the range of about 10000 to about 2000000 g/mol, particularly preferably in the range of about 100000 to about 1500000 g/mol, and very particularly preferably in the range of about 200000 to about 1000000 g/mol. The determination of MW can be performed according to standard techniques known to the person skilled in the art by employing gel permeation chromatography (GPC) with polystyrene as internal standard, for instance.

A blend may be a mixture including at least one polymeric dendrimeric, or oligomeric component.

The said photoluminescent material may be chosen from the class of organic photoluminescent emitter materials, which can be small molecules, oligomers, polymers, dendrimers, or a blend thereof. The term emitter refers to a material which upon receiving excitonic energy optically or electronically undergoes radiative decay to emit light. There are two classes of emitters, fluorescent emitters and phosphorescent emitters. The term fluorescent emitter relates to materials or compounds which undergo a radiative transition from an excited singlet state to its ground state. Thus, fluorescent emitters are sometimes also called singlet emitters. The term phosphorescent emitter relates to luminescent materials or compounds which include transition metals, which also comprise rare earth metals, lanthanides and actinides. Phosphorescent emitters predominately emit light by spin forbidden transitions occur, e.g., transitions from excited triplet and/or quintet states.

The term dopant as employed herein is also used for the term emitter or emitter material. In principle any photoluminescent compound can be used according to the present invention.

Blue fluorescent emitters may preferably be polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imine-boron compounds (US 2007/0092753 A1), bis(azinyl)methene compounds and carbostyryl compounds.

Further preferred blue fluorescent emitters may be emitters which are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

Preferred fluorescent dopants according to embodiments may be chosen from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups may particularly preferably be stilbenes, which may also be further substituted. The corresponding phosphines and ethers are defined analogously to the amines. For the purposes of this invention, an arylamine or an aromatic amine is taken to optionally mean a compound which contains three substituted or unsubstituted aromatic or heteroaromatic ring systems bonded directly to the nitrogen. At least one of these aromatic or heteroaromatic ring systems may preferably be a condensed ring system, preferably having at least 14 aromatic ring atoms. Preferred examples thereof are aromatic anthracene-amines, aromatic anthracene-diamines, aromatic pyrene-amines, aromatic pyrene-diamines, aromatic chrysene-amines and aromatic chrysene-diamines. An aromatic anthracene-amine may be taken to mean a compound in which one diarylamino group is bonded directly to an anthracene group, preferably in the 9 position. An aromatic anthracene-diamine may be taken to mean a compound in which two diarylamino groups are bonded directly to an anthracene group, preferably in the 9,10-position. Aromatic pyrene-amines, pyrene-diamines, chrysene-amines and chrysene-diamines are defined analogously thereto, where the diarylamino groups on the pyrene are preferably bonded in the 1 position or in the 1,6-position.

Further preferred fluorescent dopants may be chosen from indenofluorene-amines and indenofluorene-diamines, for example in accordance with WO 2006/122630, benzoindenofluorene-amines and benzoindenofluorene-diamines, for example in accordance with WO 2008/006449, and dibenzoindenofluorene-amines and dibenzoindenofluorene-diamines, for example in accordance with WO 2007/140847.

Examples of dopants from the class of the styrylamines are substituted or unsubstituted tristilbene-amines or the dopants described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further suitable styrylamines are disclosed in US 2007/0122656 A1.

Particularly preferred styrylamine dopants and triarylamine dopants are the compounds of the Formulae (1) to (6) and as disclosed in U.S. Pat. No. 7,250,532 B2, DE 102005058557 A1, CN 1583691 A, JP 08053397 A, U.S. Pat. No. 6,251,531 B1, and US 2006/210830 A.

Formula (1)

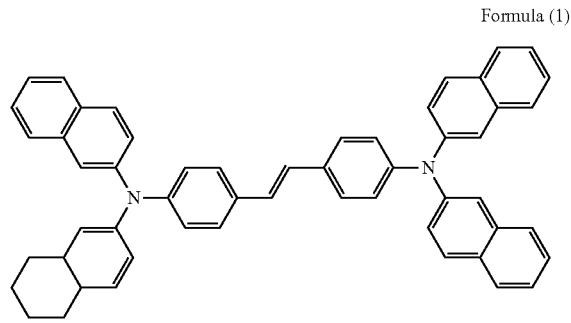

Formula (2)

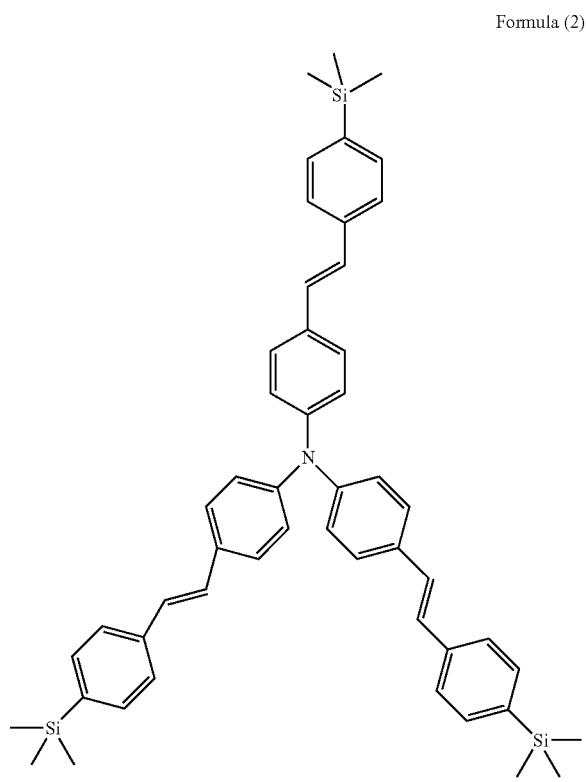

Formula (3)

Formula (4)

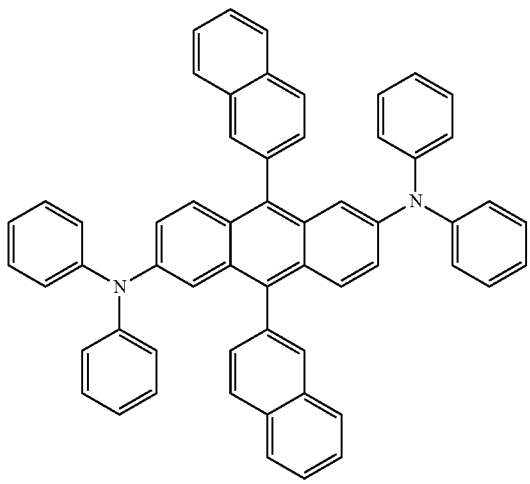

Formula (5)

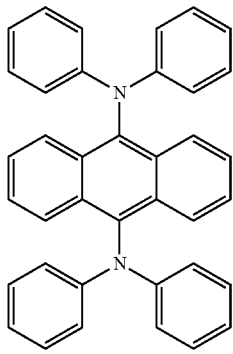

Formula (6)

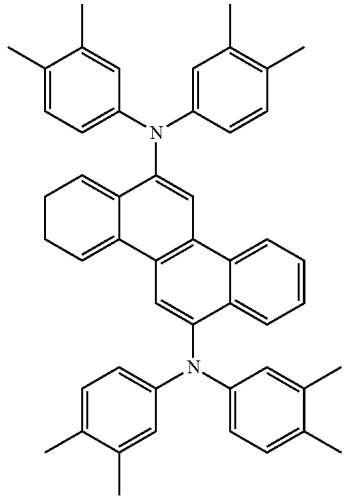

Further preferred fluorescent dopants may be chosen from the group of triarylamines as disclosed in EP 1957606 A1 and US 2008/0113101 A1.

Further preferred fluorescent dopants may be chosen from derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, particular preference may be given to 9,10-substituted anthracenes, such as, for example, 9,10-diphenylanthracene and 9,10-bis(phenylethynyl)anthracene. 1,4-Bis(9'-ethynylanthracenyl)-benzene may be also a preferred dopant.

Examples of phosphorescent emitters suitable are disclosed in WO 00/70655, WO 01/41512, WO 02/02714, WO 02/15645, EP 1191613, EP 1191612, EP 1191614 and WO 2005/033244. In general, all phosphorescent complexes as used in accordance with the prior art for phosphorescent OLEDs and as are known to the person skilled in the art in the area of organic electroluminescence are suitable.

The phosphorescent emitter may be a metal complex, preferably with the formula $M(L)_z$, wherein M is a metal atom, L is in each occurrence independently of one another an organic ligand that is bonded to or coordinated with M via one, two or more positions, and z is an integer $\geq 1$, preferably 1, 2, 3, 4, 5 or 6, and wherein, optionally, these groups are linked to a polymer via one or more, preferably one, two or three positions, preferably via the ligands L.

M may be in particular a metal atom chosen from transition metals, preferably chosen from transition metals of group VIII, or lanthanoides, or actinides, particularly preferably chosen from Rh, Os, Ir, Pt, Pd, Au, Sm, Eu, Gd, Tb, Dy, Re, Cu, Zn, W, Mo, Pd, Ag, or Ru, and very particularly preferably chosen from Os, Ir, Ru, Rh, Re, Pd, or Pt. M may also be Zn.

Preferred ligands L may be 2 phenylpyridine derivatives, 7,8-benzo-quinoline derivatives, 2 (2-thienyl)pyridine derivatives, 2 (1-naphthyl)-pyridine derivatives or 2 phenylquinoline derivatives. All these compounds may be substituted, for example by fluoro- or trifluoromethyl substituents for blue. Auxiliary ligands are preferably acetylacetonate or picric acid.

In particular, complexes of Pt or Pd with tetradentate ligands of the Formula (7) as disclosed in US 2007/0087219 A1, wherein $R^1$ to $R^{14}$ and $Z^1$ to $Z^5$ are as defined in the reference, Pt porphyrin complexes having an enlarged ring system (US 2009/0061681 A1) and Ir complexes are suitable, for example 2,3,7,8,12,13,17,18-octaethyl-21H, 23H-porphyrin-Pt(II), tetraphenyl-Pt(II)-tetrabenzoporphyrin (US 2009/0061681 A1), cis-bis(2-phenylpyridinato-N,C2') Pt(II), cis-bis(2-(2'-thienyl)pyridinato-N,C3')Pt(II), cis-bis (2-(2'-thienyl)quinolinato-N,C5')Pt(II), (2-(4,6-difluorophenyl)pyridinato-N,C2')Pt(II) acetylacetonate, or tris(2-phenylpyridinato-N,C2')Ir(III) (Ir(ppy)₃, green), bis(2-phenylpyridinato-N,C2)Ir(III) acetylacetonate (Ir(ppy)₂ acetylacetonate, green, US 2001/0053462 A1, Baldo, Thompson et al. Nature 403, (2000), 750-753), bis(1-phenylisoquinolinato-N,C2')(2-phenylpyridinato-N,C2')iridium (III), bis(2-phenylpyridinato-N,C2')-(1-phenylisoquinolinato-N,C2')iridium(III), bis(2-(2'-benzothienyl)pyridinato-N,C3')iridium(III) acetylacetonate, bis(2-(4',6'-difluorophenyl)pyridinato-N,C2')iridium(III) piccolinate (Firpic, blue), bis(2-(4',6'-difluorophenyl)-pyridinato-N,C2') Ir(III) tetrakis(1-pyrazolyl)borate, tris(2-(biphenyl-3-yl)-4-tert-butylpyridine)indium(III), (ppz)₂Ir(5phdpym) (US 2009/0061681 A1), (45ooppz)₂Ir(5phdpym) (US 2009/ 0061681 A1), derivatives of 2 phenyl-pyridine-Ir complexes, such as, for example, iridium(III) bis(2-phenylquinolyl-N,C2')acetylacetonate (PQIr), tris(2-phenylisoquinolinato-N,C)Ir(III) (red), bis(2-(2'-benzo[4,5-a]thienyl)pyridinato-N,C3)Ir acetylacetonate ([Btp2Ir (acac)], red, Adachi et al. Appl. Phys. Lett. 78 (2001), 1622-1624).

Formula (7)

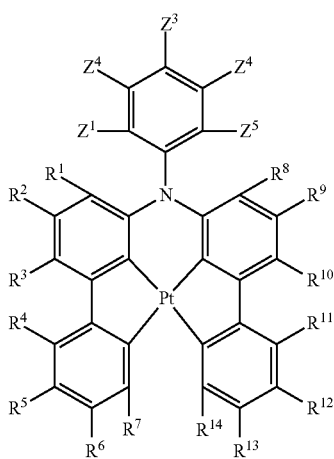

Also suitable are complexes of trivalent lanthanides, such as, for example, Tb$^{3+}$ and Eu$^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl diimine complexes (Wrighton, JACS 96, 1974, 998 inter alia), Os(II) complexes with cyano ligands and bipyridyl or phenanthroline ligands (Ma et al., Synth. Metals 94, 1998, 245) or Alq$_3$ without a host.

Further phosphorescent emitters with tridentate ligands are described in U.S. Pat. No. 6,824,895 and U.S. Pat. No. 7,029,766. Red-emitting phosphorescent complexes are mentioned in U.S. Pat. No. 6,835,469 and U.S. Pat. No. 6,830,828.

A particularly preferred phosphorescent dopant may be a compound with the Formula (8) and further compounds as disclosed, e.g., in US 2001/0053462 A1.

A particularly preferred phosphorescent dopant may be a compound with the Formula (9) and further compounds as disclosed, e.g., in WO 2007/095118 A1

Formula (8)

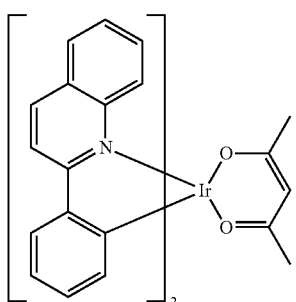

Formula (9)

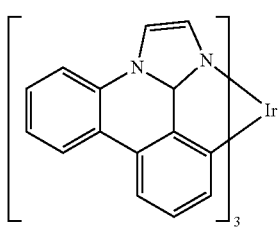

Further derivatives are described in U.S. Pat. No. 7,378, 162 B2, U.S. Pat. No. 6,835,469 B2, and JP 2003/253145 A.

Further to metal complex mentioned elsewhere herein, a suitable metal complex according to embodiments can be chosen from transition metals, rare earth elements, lanthanides and actinides and may be also subject of embodiments described herein. Preferably the metal may be chosen from Ir, Ru, Os, Eu, Au, Pt, Cu, Zn, Mo, W, Rh, Pd, or Ag.

Furthermore, the said organic photoluminescent material can be selected from emissive polymers.

The said polymer can be a polymer comprising at least one emissive repeating unit comprising SM photoluminescent unit as described above. The said polymer may further preferably comprise one non-emissive dye unit.

The difference between polymers, oligomers and dendrimers is due to the size, size distribution, and branching of the molecular entities as defined above.

Different structures are, inter alia, those as disclosed and extensively listed in WO 2002/077060 A1 and in DE 10337346 A1. The structural units may originate, for example, from the following groups:

Group 1: units which increase the hole-injection and/or transport properties of the polymers; it corresponds to the HIMs or HTMs as described above or bellow.

Group 2: units which increase the electron-injection and/or transport properties of the polymers; it corresponds to the EIMs or ETMs as described above or bellow.

Group 3: units which have combinations of individual units from group 1 and group 2;

Group 4: units which modify the emission characteristics to such an extent that electrophosphorescence may be obtained instead of electrofluorescence; typically, it corresponds to the phosphorescent emitter, or more preferably emissive metal complexes as described above or bellow.

Group 5: units which improve the transition from the so called singlet state to higher spin states, e.g. to a triplet state;

Group 6: units which influence the morphology and/or emission colour of the resultant polymers;

Group 7: units which are typically used as backbone and which may have electron transport function, hole transport function or both.

Group 8: units which have strong absorption in at least one wavelength from UV to infrared. It corresponds to the dye materials as described above.

Preferred units from group 1 are, for example, triarylamine, benzidine, tetraaryl-para-phenylenediamine, carbazole, azulene, thiophene, pyrrole and furan derivatives and further O, S or N containing heterocycles with a high HOMO. These arylamines and heterocycles preferably result in an HOMO in the polymer of greater than 5.8 eV (against vacuum level), particularly preferably greater than 5.5 eV.

Particularly preferred units from group 1 can be selected from one of following repeating unit according to Formula (10).

Formula (10)

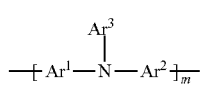

wherein

Ar¹ which may be the same or different, denote, independently if in different repeating units, a single bond or an optionally substituted mononuclear or polynuclear aryl group, Ar² which may be the same or different, denote, independently if in different repeating units, an optionally substituted mononuclear or polynuclear aryl group, Ar³ which may be the same or different, denote, independently if in different repeating units, an optionally substituted mononuclear or polynuclear aryl group, m is 1, 2 or 3.

Particularly preferred units of Formula (10) may be chosen from the group consisting of the Formulae (11) to (13)

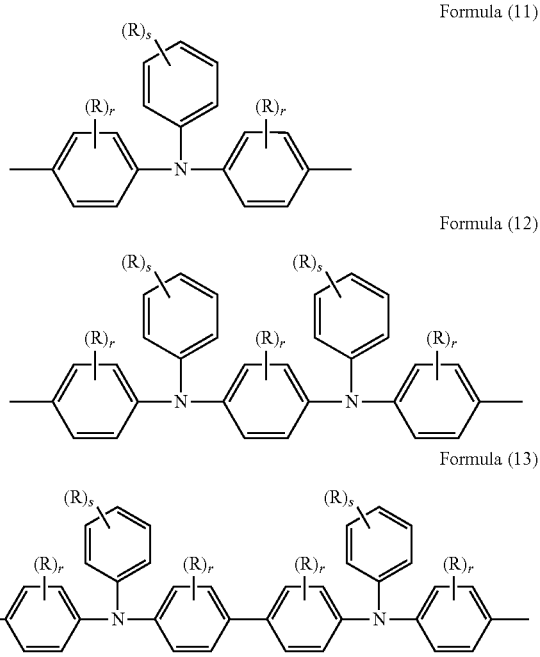

Formula (11)

Formula (12)

Formula (13)

wherein

R, which may be the same or different in each occurrence, may be chosen from H, substituted or unsubstituted aromatic or heteroaromatic group, alkyl, cycloalkyl, alkoxy, aralkyl, aryloxy, arylthio, alkoxycarbonyl, silyl, carboxy group, a halogen atom, cyano group, nitro group or hydroxy group, r is 0, 1, 2, 3 or 4, and s is 0, 1, 2, 3, 4 or 5.

Further particularly preferred units from group 1 can be selected from one of following one of following repeating unit according to Formula (14).

Formula (14)

wherein $T^1$ and $T^2$ are independently of each other chosen from thiophene, selenophene, thieno[2,3b]thiophene, thieno[3,2b]thiophene, dithienothiophene, pyrrole, aniline, all of which are optionally substituted with $R^5$, $R^5$ is in each occurrence independently of each other chosen from halogen, —CN, —NC, —NCO, —NCS, —OCN, SCN, C(=O)NR°R°°, —C(=O)X, —C(=O)R°, —NH₂, —NR°R°°, SH, SR°, —SO₃H, —SO₂R°, —OH, —NO₂, —CF₃, —SF₅, optionally substituted silyl, or carbyl or hydrocarbyl with 1 to 40 C atoms that is optionally substituted and optionally contains one or more hetero atoms, Ar⁴ and Ar⁵ are independently of each other mononuclear or polynuclear aryl or heteroaryl, which is optionally substituted and optionally fused to the 2,3-positions of one or both of the adjacent thiophene or selenophene groups, c and e are independently of each other 0, 1, 2, 3 or 4, with 1<c+e≤6, d and f are independently of each other 0, 1, 2, 3 or 4.

Preferred units from group 2, which have electron-injection or electron-transport properties, are, for example, pyridine, pyrimidine, pyridazine, pyrazine, oxadiazole, quinoline, quinoxaline and phenazine derivatives, but also triarylboranes and further O, S or N containing heterocycles having a low LUMO. These units in the polymer preferably result in an LUMO of less than 2.7 eV (against vacuum level), particularly preferably less than 2.8 eV.

Preferably, the said emissive polymer may be a polymer including units from group 3 in which structures which increase the hole mobility and the electron mobility (i.e. units from groups 1 and 2) are bonded directly to one another. Some of these units may serve as emitters and shift the emission colour into the green, yellow or red. Their use is thus suitable, for example, for the production of other emission colours or a broad-band.

Preferably, the said emissive polymer may be a polymer including units of group 4, which is preferably chosen from the groups including phosphorescent emitter, particularly emissive metal complexes as described above. Particular preference may be given here to corresponding structural units which contain elements from groups 8 to 10 (Ru, Os, Rh, Ir, Pd, Pt).

Preferably, the said emissive polymer may be a polymeric triple matrix including units of group 5, which can improve the transition from the singlet state to the triplet state and which, employed in support of the structural elements from group 4, improve the phosphorescence properties of these structural elements. Suitable for this purpose are, in particular, carbazole and bridged carbazole dimer units, as described in DE 10304819 A1 and DE 10328627 A1. Also suitable for this purpose are ketones, phosphine oxides, sulfoxides, sulfones, silane derivatives and similar compounds, as described in DE 10349033 A1. Further preferred structure units can be chosen from groups including the low molecular weight phosphorescent matrices as described above.

Preferably, the said emissive polymer may be chosen from a polymer including units of group 6, which influence the morphology and/or emission colour of the polymers and are, besides those mentioned above, those which have at least one further aromatic or another conjugated structure which do not fall under the above-mentioned groups, i.e. which have only little effect on the charge-carrier mobilities, which are not organometallic complexes or which have no influence on the singlet-triplet transition.

Structural elements of this type may influence the morphology and/or emission colour of the resultant polymers. Depending on the unit, they can therefore also be employed as emitters. Preference may be given here to aromatic structures having 6 to 40 C atoms or also tolan, stilbene or bisstyrylarylene derivatives, each of which may be substituted by one or more radicals R1. Particular preference may be given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylene, 4,4"-terphenylylene, 4,4' bi 1,1'-naphthylylene, 4,4'-tolanylene, 4,4'-stilbenylene or 4,4"-bisstyrylarylene derivatives.

Preferably, the said emissive polymer may be a polymer including units of group 7 which contain aromatic structures having 6 to 40 C atoms which are typically used as polymer backbone. These are, for example, 4,5-dihydropyrene derivatives, 4,5,9,10-tetrahydropyrene derivatives, fluorene derivatives as disclosed for example in U.S. Pat. No. 5,962,631, WO 2006/052457 A2 and WO 2006/118345A1, 9,9'-spirobifluorene derivatives as disclosed for example in WO 2003/020790 A1, 9,10-phenanthrene derivatives as disclosed, for example, in WO 2005/104264 A1, 9,10-dihydrophenanthrene derivatives as disclosed for example in WO 2005/014689 A2, 5,7-dihydrodibenzooxepine derivatives and cis- and trans-indenofluorene derivatives as disclosed for example in WO 2004041901 A1, WO 2004113412 A2 and, binaphthylene derivatives as disclosed for example in WO 2006/063852 A1, and further units as disclosed for example in WO 2005/056633A1, EP 1344788A1 and WO 2007/043495A1, WO 2005/033174 A1, WO 2003/099901A1 and DE 102006003710.3.

Further preferred structural elements from group 7 may be chosen from fluorene derivatives, as disclosed for example in U.S. Pat. No. 5,962,631, WO 2006/052457 A2 and WO 2006/118345 A1, spiro-bifluorene derivatives as disclosed for example in WO 2003/020790 A1, benzofluorene, dibenzofluorene, benzothiophene, dibenzofluorene and their derivatives as disclosed for example in WO 2005/056633A1, EP 1344788A1 and WO 2007/043495A1 Very preferred structural elements of group 7 may be those of Formula (15):

Formula (15)

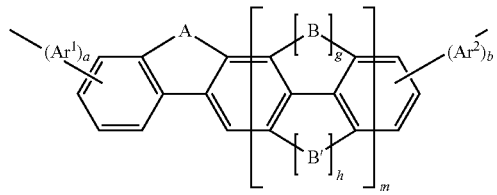

wherein

A, B and B' are independently of each other, and in case of multiple occurrence independently of one another, a divalent group, preferably chosen from —CR$^1$R$^2$—, —NR$^1$—, —PR$^1$—, —O—, —S—, —SO—, —SO$_2$—, —CO—, —CS—, —CSe—, —P(=O)R$^1$—, —P(=S)R$^1$— and —SiR$^1$R$^2$—, R$^1$ and R$^2$ are independently of each other identical or different groups chosen from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally includes one or more hetero atoms, and optionally the groups R$^1$ and R$^2$ form a Spiro group with the fluorene moiety to which they are attached, X is halogen, R$^0$ and R$^{00}$ are independently of each other H or an optionally substituted carbyl or hydrocarbyl group optionally including one or more hetero atoms, each g is independently 0 or 1 and each corresponding h in the same subunit is the other of 0 or 1, m is an integer ≥1

Ar$^1$ and Ar$^2$ are independently of each other mono- or polynuclear aryl or heteroaryl that is optionally substituted and optionally fused to the 7,8-positions or 8,9-positions of the indenofluorene group, a and b are independently of each other 0 or 1.

If the groups R$^1$ and R$^2$ form a spiro group with the fluorene group to which they are attached, it is preferably spirobifluorene.

The groups of Formula (15) may be preferably chosen from the following Formulae (16) to (20):

Formula (16)

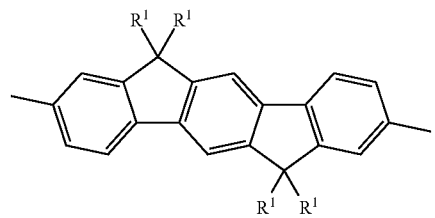

Formula (17)

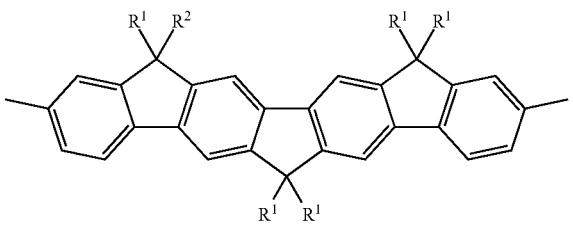

Formula (18)

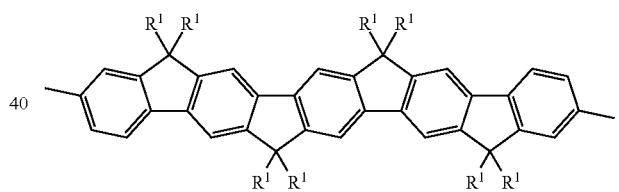

Formula (19)

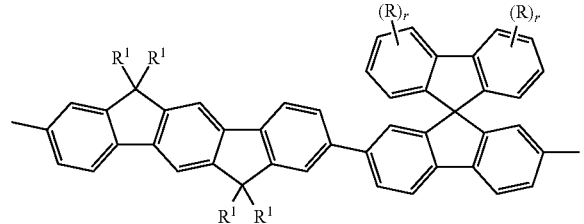

Formula (20)

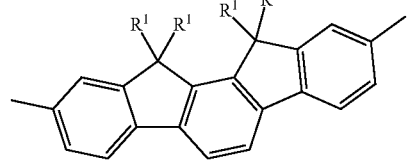

wherein R$^1$ is as defined in Formula (15), r is 0, 1, 2, 3 or 4, and R has one of the meanings of R$^1$.

R is preferably F, Cl, Br, I, —CN, —NO$_2$, —NCO, —NCS, —OCN, —SCN, —C(=O)NR$^0$R$^{00}$, —C(=O)X$^0$, —C(=O)R$^0$, —NR$^0$R$^{00}$, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, and wherein $R^o$, $R^{oo}$ and $X^o$ are as defined above.

Particularly preferred groups of Formula (15) may be chosen from the following Formulae (21) to (24):

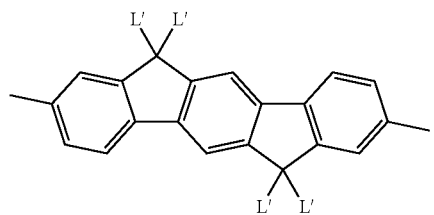

Formula (21)

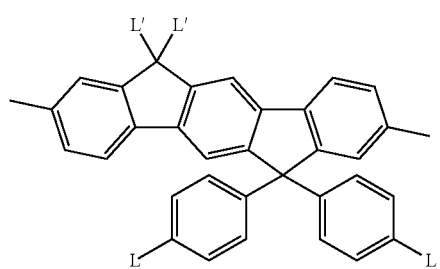

Formula (22)

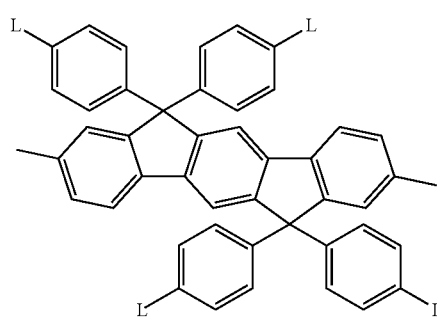

Formula (23)

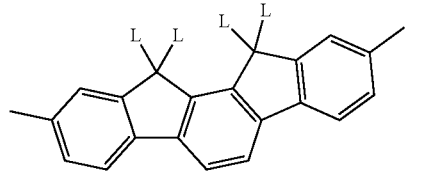

Formula (24)

wherein

L may be chosen from H, halogen or optionally fluorinated, linear or branched alkyl or alkoxy with 1 to 12 C atoms, and may preferably be H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

The said emissive polymer may be a polymer including group 8, which can be chosen from the groups including the dye materials as described above. The conjugated polymers suitable for organic solar cells, as summarized for example by F. C. Krebs, in Solar Energy Materials and Solar Cells, Vol 91, 953 (2007), can also be used as the said organic functional material in embodiments described herein.

The proportion of the different classes of groups, if present in the polymer, may be preferably in each case at least 5 mol %, particularly preferably in each case at least 10 mol %.

However, a smaller proportion of the emitting units, in particular green- and red-emitting units, may also be preferred, for example for the synthesis of broad-band emissive copolymers. The way in which white-emitting copolymers can be synthesised is described in detail in DE 10343606 A1.

In order to ensure adequate solubility, it may be preferred for on average at least 2 non-aromatic C atoms to be present in the substituents per recurring unit. Preference may be given here to at least 4 and particularly preferably at least 8 C atoms. In addition, individual C atoms of these may be replaced by O or S. However, it may be entirely possible for this to mean that a certain proportion of recurring units does not carry any further non-aromatic substituents.

In order to avoid impairing the morphology of the film, it may be preferred to have no long-chain substituents having more than 12 C atoms in a linear chain, particularly preferably none having more than 8 C atoms and in particular none having more than 6 C atoms.

The polymer used as organic photoluminescent material in embodiments may be chosen from statistical or random copolymers, alternating or regioregular copolymers, block copolymers or combinations thereof.

In a very preferred embodiment, the polymer is a conjugated polymer, wherein the functional groups as described above and bellow are integrated into the polymer main chain.

In another preferred embodiments, the composition according to the present invention comprises an organic emitter which is a non-conjugated polymer.

Particularly preferably, the composition according to present invention comprises a non-conjugated polymer, which includes at least one phosphorescent emitter as repeating unit.

In a further preferred embodiment, the said organic photoluminescent material is a non-conjugated side-chain polymer, which comprises at least one emitter unit and yet preferably at least further functional unit selected from Host, HIM, HTM, EIM, ETM and Emitter as described above. In general, such phosphorescent polymer may be obtained by means of radical copolymerization of vinyl compounds, and includes at least one phosphorescent emitter and preferably at least one charge transport unit on side chain, as disclosed in U.S. Pat. No. 7,250,226 B2. Further examples for such phosphorescent polymer are disclosed for example in JP 2007/211243 A2, JP 2007/197574 A2, U.S. Pat. No. 7,250, 226B2, JP 2007/059939A.

In a further embodiment, the said organic photoluminescent material may be a non-conjugated main-chain polymer, also referred to herein as non-conjugated backbone polymer, where the backbone units are connected by spacers on a main-chain. Like non-conjugated side-chain polymers, non-conjugated main-chain polymers give also a high triplet level. The backbone unit can be selected from host material, matrix materials, and members of group 5 and group 7 as described above. An example for phosphorescent polymer based on non-conjugated main-chain polymers is disclosed in DE 102009023154.4.

Very preferably, the non-conjugated or partially-conjugated polymer comprises a non-conjugated backbone unit.

The preferred non-conjugated backbone unit is selected from a unit comprising indenofluorene derivatives, as for example in the following formula as disclosed in DE 102009023156.0

Formula (25)

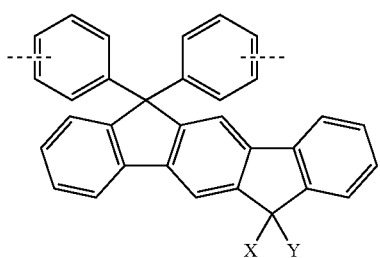

(Formula (26))

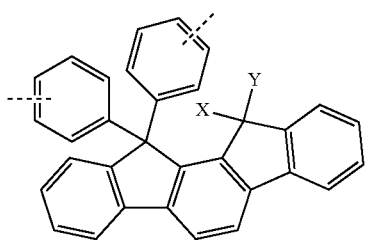

wherein X and Y are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

Further preferred non-conjugated backbone unit is selected from a unit comprising fluorene, phenanthrene, dehydrophenanthrene, indenofluorene derivatives, as for example in the following formulae as disclosed in DE 102009023154.

Formula (27)

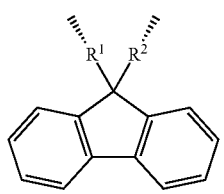

Formula (28)

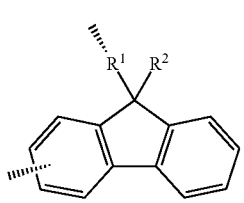

Formula (29)

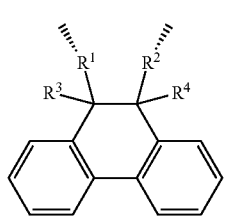

Formula (30)

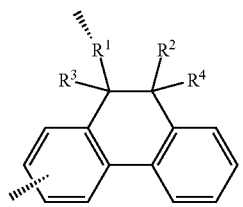

Formula (31)

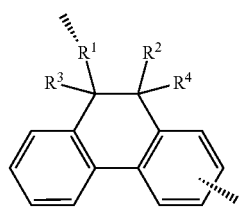

Formula (32)

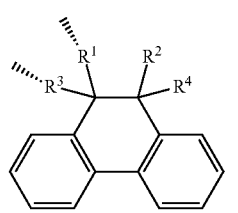

Formula (33)

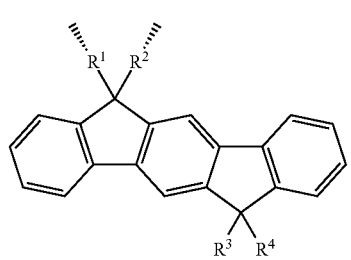

Formula (34)

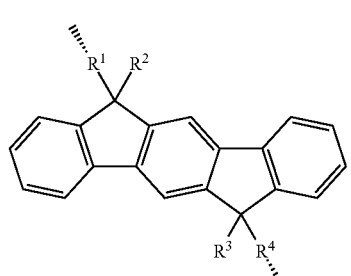

Formula (35)

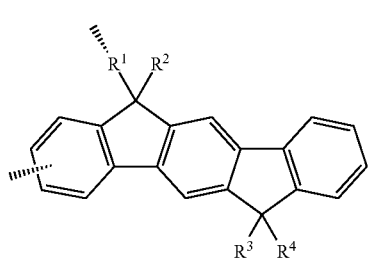

-continued

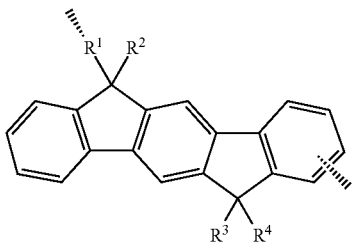
Formula (36)

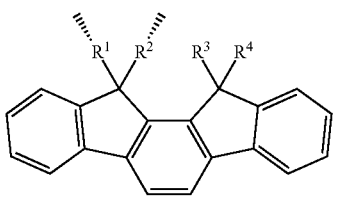
Formula (37)

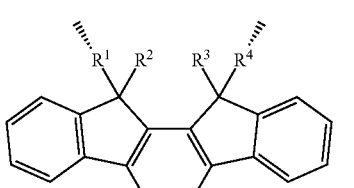
Formula (38)

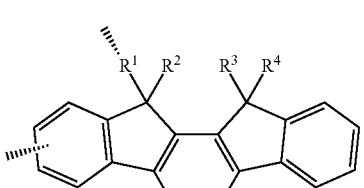
Formula (39)

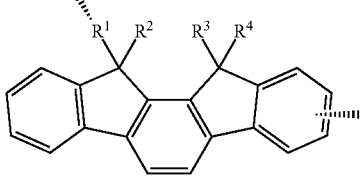
Formula (40)

wherein $R^1$ to $R^4$ are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

In a further embodiment, the said polymer can also be a non-conjugated fluorescent polymer. Preferred fluorescent non-conjugated polymers are, for example, side-chain polymers comprising at least one singlet emitter, further optionally other group selected from antracenenes, benzanthrecenes and their derivates in the side-chain, as disclosed in JP 2005/108556, JP 2005/285661, JP 2003/338375 etc.

In another particularly preferred embodiment, the emissive polymer as described above further comprises at least one cross-linkable group. Cross-linking group is a group comprising a cross-linking reagent, which leads to a cross-linking reaction with the help of heating, or radiation or both. The radiation source can be selected from electron beam and UV light. The preferred UV light is selected from wavelength from 200-400 nm. For organic electronic device, UVA or a radiation from 300-400 nm is particularly preferred. The suitable UV source are for example mercury Ultraviolet fluorescent lamps, Ultraviolet LEDs, UV laser diodes and UV solid-state lasers Suitable cross-linkable groups are for example, acrylate group as disclosed for example by Scheler et al., in Macromol. Symp. 254, 203-209 (2007), vinyl group or styrene group as disclosed for example in WO 2006043087 A1, and oxetane group as disclosed by Mueller et al., in Nature 421, 829-833 (2003), and azide group as disclosed for example in WO 2004100282 A2

Preference is given to photoluminescent compounds having a broadband spectrum. If at least one photoluminescnet compound with a broadband spectrum is used, in general less quantum dots may be required to get a super white with high quality.

The term super white as used herein refers to white light with a CRI of at least 80, preferably of at least 85, particularly preferably of at least 90, and very particularly preferably of at least 95.

In a further preferred embodiment, the composition comprised by the said array comprises further a desired binder material, for example, an optically transparent and/or curable binder. Varieties of binders are well known in the art and can be adapted to practice of the present invention. In one embodiment, the binder comprises epoxy, polyurea, silicone or polyurethane.

In a preferred embodiment, particularly for the composition comprising organic photoluminescent material, the binder is an inert polymeric binder.

The said inert binder does not have semiconducting properties and does not oxidise the other components in the composition or otherwise chemically react with these materials as mentioned above and below. The inert binder does not provide conducting property either. The low conducting properties of the inert polymeric binder can be determined as low permittivity. Preferred binders according to the present invention are materials of low permittivity, that is, those having a permittivity, s at 1,000 Hz of 3.3 or less. The organic binder preferably has a permittivity at 1,000 Hz of less than 3.0, more preferably 2.9 or less. Preferably the organic binder has a permittivity at 1,000 Hz of greater than 1.7. It is especially preferred that the permittivity of the binder is in the range from 2.0 to 2.9. The terms "oxidise" and "chemically react" as used above and below refer to a possible oxidation or other chemical reaction of the binder with the other components of the composition of the array elements under the conditions used for manufacture, storage, transport and/or use of the formulation and the electronic device.

Preferably, the polymeric binder comprises a weight average molecular weight in the range of 1000 to 5,000,000 g/mol, especially 1500 to 1,000,000 g/mol and more preferable 2000 to 500,000 g/mol.

In particular, the polymeric binder can have a polydispersity index $M_w/M_n$ in the range of 1.0 to 10.0, more preferably in the range of 1.1 to 5.0 and most preferably in the range of 1.2 to 3.

Usually, the polymeric binder is dispersible or soluble in the solvent of the present composition as described above and below. Preferably, the polymeric binder is soluble in the organic solvent and the solubility of the polymeric binder in the solvent is at least 1 g/l, particularly preferably at least 5 g/l and very particularly preferably at least 10 g/l.

According to a special embodiment of the present invention, the composition of each array element can comprise 0.05 to 10% by weight, preferably 0.25 to 5% by weight, particularly preferably 0.5 to 4% by weight polymeric binder.

According to a special embodiment the polymeric binders preferably comprise repeating units derived from styrene and/or olefins. Preferred polymeric binders can comprise at least 80%, particularly preferably 90% and very particularly preferably 99% by weight of repeating units derived from styrene monomers and/or olefins.

Styrene monomers are well known in the art. These monomers include styrene, substituted styrenes with an alkyl substituent in the side chain, such as α-methylstyrene and α-ethylstyrene, substituted styrenes with an alkyl substituent on the ring such as vinyltoluene and p-methylstyrene, halogenated styrenes such as monochlorostyrenes, dichlorostyrenes, tribromostyrenes and tetrabromostyrenes.

Olefins are monomers consisting of hydrogen and carbon atoms. These monomers include ethylene, propylene, butylenes, isoprene and 1,3-butadiene.

According to a special aspect of the present invention, the polymeric binder is polystyrene having a weight average molecular weight in the range of 50,000 to 2,000,000 g/mol, preferably 100,000 to 750,000 g/mol, particularly preferably in the range of 180000 to 600000 g/mol and very particularly preferably in the range of 250000 to 500000 g/mol.

According to a further embodiment of the present invention, the polymeric binder is poly-4-methyl styrene having a weight average molecular weight in the range of 40,000 to 120,000 g/mol, more preferably in the range of 60,000 to 100,000 g/mol.

Particularly, the binder can be poly-α-methyl styrene having a weight average molecular weight in the range of 1,000 to 20,000 g/mol, particularly preferably in the range of 1,500 to 6,000 g/mol.

In a further preferred embodiment, the composition composed by the array of the present invention further comprises a non-emissive dye. Using a non-emissive dye in embodiments allows to better design the desired broadband spectrum, since the dye can be chosen to absorb undesired components of the spectrum, in case that one just wants to remove or reduce some part of emission.

A dye can generally be described as an inorganic or organic substance that absorbs light and, therefore, appears colored. The definition of dyes described herein can be light absorbing materials which harvest light in order to transmit the light energy to further materials either in any other kind of converted energy.

In principle any dye, which is suitable for organic solar cells or organic dye-sensitized solar cells, can be used as non-emissive dye in the present invention.

Further to dyes mentioned elsewhere herein, according to embodiments, non-emissive dyes can be chosen from perylenes, ruthenium dyes, phthalocyanines, azo dyes, perylene-diimides, porphyrines, squaraines, isomers and derivatives thereof.

Preferably, the said non-emissive dye may be chosen from perylenes, ruthenium dyes, phthalocyanines, azo dyes, perylene-diimides, porphyrines, and squaraines. Also preferred dyes may be chosen from ruthenium complexes as disclosed by Yu Bai et. al., in Nature Materials, Vol 7, 626 (2008) and by B. O'Regan et. al., in Nature 353, 737 (1991), and Cu based complexes as disclosed by Bessho et al, in Chem. Commun. 3717 (2008).

Further, the said dyes used in embodiments may be chosen from acridines, anthraquinones, arylmethanes, diarylmethanes, triarylmethanes, azo-based dyes, cyanines, diazonium-based dyes, nitro-based dyes, nitroso-based dyes, quinone-imines, azin-based dyes, eurhodines, safranines, indulines, indamins, indophenoles, oxazines, oxazones, thiazines, thiazoles, xanthenes, fluorenes, pyronines, fluorones, and rhodamines.

In addition to dyes used in embodiments described herein, charge generation materials can also have the same function as a non-emissive dye. They are, for example, used for electrophotographic devices. Thus charge generation materials as summarized by Paul M. Borsenberger; and David S. Weiss in Organic Photorecptors for Xerography; Marcel Dekker, Inc., 1998, Chapter 6, and by K. Y. Law, Chem. Rev. Vol 93, 449-486 (1993) are herein also considered as suitable dye.

Further suitable dyes may be chosen from organic compounds containing fused ring system, for example anthracene, naphthalene, pentacene and tetracence derivatives.

In a further embodiment the array according to the present invention is characterized in that it comprises at least one further functional material selected from inorganic phosphor materials as inorganic photoluminescent material.

Suitable inorganic photoluminescent materials can be preferably selected from phosphor materials, which may be used for example, for cathode-ray tubes and fluorescent display or lamps. Generally, the suitable phosphor materials can be selected from yttrium oxide, yttrium tantalite, barium fluoride, cesium fluoride, bismuth germanate, zinc gallate, calcium magnesium pyrosilicate, calcium molybdate, calcium chlorovanadate, barium titanium pyrophosphate, a metal tungstate, a cerium-doped phosphor, a bismuth doped phosphor, a lead-doped phosphor, a thallium-doped sodium iodide, a doped cesium iodide, a rare earth-doped pyrosilicate, and a lanthanide halide.

In a preferred embodiment, the inorganic photoluminescent material is a phosphor which has a narrow emission spectrum. Such kind of phosphor can be selected from compounds comprising rare-earth recombination centres, which shows characteristic luminescence lines instead of bands due to the irradiation transition in the 4fn shell which is well shielded electrically by 5d and 6s electrons. Preferably, such kind of phosphors have an absorption at wavelength 380 nm or more, and can be selected from for examples $Y_2O_3$:Sm, $Y_2O_3$:Eu, $Y_2O_3$:Dy and $Y_2O_3$:Ho, as disclosed by Lyuji Ozawa and Minoru Itoh in Chem. Rev. Vol 103 pp 3836 (2003), and the references therein. Further preferred phosphors can be selected from, but without limitation, ZnS: Cu, Al, ZnS:Cu, Au, Al, $Y_2O_2$S:Eu, $Y_2O_2$S: Eu, $Zn_2SiO_4$:Mn, $(KF,MgF_2)$:Mn, $(KF,MgF_2)$:Mn, $MgF_2$: Mn, $(Zn,Mg)F_2$:Mn, $Zn_2SiO_4$:Mn, As, $Gd_2O_2$S:Tb, $Y_2O_2$S: Tb, $Y_3Al_5O_{12}$:Tb, $Y_3(Al,Ga)_5O_{12}$:Tb, $Y_2O_3$:Eu, $InBO_3$:Tb, $InBO_3$:Eu, $Y_2SiO_5$:Tb.

In a very preferred embodiment, the inorganic photoluminescent material is a phosphor which has a broad emission spectrum and is particularly good for general lighting applications, can be selected from, but without limitation, YAG:Ce, ZnS:Ag+(Zn,Cd)S:Cu, (Zn,Cd)S:Ag, (Zn,Cd)S: Cu, (Zn,Cd)S:(Cu,Cl), ZnS:Ag+(Zn,Cd)S:Cu, $Y_2O_2$S:Tb, (Zn,Cd)S:Cu,Cl+(Zn,Cd)S:Ag,Cl, ZnS:Ag+ZnS:Cu(or ZnS: Cu,Au)+$Y_2$)$_2$S:Eu, $InBO_3$:Tb+$InBO_3$:Eu+ZnS:Ag, $InBO_3$: Tb+$InBO_3$:Eu.

Further suitable phosphor materials, which can be used in the present invention, are listed as follows: $Ba_2SiO_4$:$Eu^{2+}$, $BaSi_2O_5$:$Pb^{2+}$, $Ba_xSri_{1-x}F_2$:$Eu^{2+}$, $BaSrMgSi_2O_7$:$Eu^{2+}$, $BaTiP_2O_7$, $(Ba,Ti)_2P_2O_7$:Ti, $Ba_3WO_6$:U, $BaY_2F_8Er^{3+}$, $Yb^+$, $Be_2SiO_4$:$Mn^{2+}$, $Bi_4Ge_3O_{12}$, $CaAl_2O_4$:$Ce^{3+}$, $CaLa_4O_7$:$Ce^{3+}$, $CaAl_2O_4$:$Eu^{2+}$, $CaAl_2O_4$:$Mn^{2+}$, $CaAl_4O_7$:$Pb^{2+}$, $Mn^{2+}$, $CaAl_2O_4$:$Tb^{3+}$, $Ca_3Al_2Si_3O_{12}$:$Ce^{3+}$, $Ca_3Al_2Si_3Oi_2$:$Ce^{3+}$, $Ca_3Al_2Si_3O_{,2}$:$Eu^{2+}$, $Ca_2B_5O_9Br$:$Eu^{2+}$, $Ca_2B_5O_9Cl$:$Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^{2+}$, $Ca_2Ba_3(PO4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaF_2:U$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+}$, $Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha$-$Ca_3(PO_4)_2:Ce^{3+}$, $\beta$-$Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta$-$Ca_3(PO_4)_2:Eu^{2+}$, $Mn^{2+}$, $Ca_5(PO_4)_3F:Mn^{2+}$, $Ca_s(PO_4)_3F:Sb^{3+}$, $Ca_s(PO_4)_3F:Sn^{2+}$, $\alpha$-$Ca_3(PO_4)_2:Eu^{2+}$, $\beta$-$Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha$-$Ca_3(PO_4)_2:Pb^{2+}$, $\alpha$-$Ca_3(PO_4)_2:Sn^{2+}$, $\beta$-$Ca_3(PO_4)_2:Sn^{2+}$, $\beta$-$Ca_2P_2O_7:Sn$, $Mn$, $\alpha$-$Ca_3(PO_4)_2:Tr$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4:Eu^{2+}$, $Mn^{2+}$, $CaSO_4:Pb^{2+}$, $CaS:Pb^{2+}$, $CaS:Pb^{2+}$, $Cl$, $CaS:Pb^{2+}$, $Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+}$, $F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSiO_3:Ce^{3+}$, $Ca_3SiO_4Cl_2:EU^{2+}$, $Ca_3SiO_4Cl_2:Pb^{2+}$, $CaSiO_3:EU^{2+}$, $CaSiO_3:Mn^{2+}$, $Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta$-$(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+$, $Cr$, $CdS:In$, $CdS:In$, $CdS:In$, $Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr$, $Ce$, $GdNbO_4:Bi^{3+}$, $Gd_2O_2S:Eu^{3+}$, $Gd_2O_2Pr^{3+}$, $Gd_2O_2S:Pr$, $Ce$, $F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La,Ce,Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+}$, $Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+}$, $Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+}$, $Mn^{2+}$, $MgBa_3Si_2O_8:Eu^{2+}$, $MgBa(SO_4)_2:Eu^{2+}$, $Mg_3Ca(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$, $Mn^2$, $MgCeAl_nO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+}$, $Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $NaI:Tl$, $Na_{1.23}K_{0.42}Eu_{0.12}TiSi_4O_{11}:Eu^{3+}$, $Na_{1.23}K_{0.42}Eu_{0.12}TiSi_5O_{13}.xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$, $NaYF_4:Er^{3+}$, $Yb^{3+}$, $NaYO_2:Eu^{3+}$, $P46(70\%)+P47$ $(30\%)$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F,Cl,Br)$, $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO.3B_2O_3:Eu^{2+}$, $Cl$, $\beta$-$SrO.3B_2O_3:Pb^{2+}$, $\beta$-$SrO.3B_2O_3:Pb^{2+}$, $Mn^{2+}$, $\alpha$-$SrO.3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+}$, $Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $\beta$-$Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+}$, $Mn^{2+}$, $Sr_5(PO_4)_3F:Sn^{2+}$, $Sr_2P_2O_7:Sn^{2+}$, $\beta$-$Sr_3(PO_4)_2:Sn^{2+}$, $\beta$-$Sr_3(PO_4)_2:Sn^{2+}$, $Mn^{2+}$ (Al), $SrS:Ce^{3+}$, $SrS:Eu^{2+}$, $SrS:Mn^{2+}$, $SrS:Cu^+$, $Na$, $SrSO_4:Bi$, $SrSO_4:Ce^{3+}$, $SrSO_4:Eu^{2+}$, $SrSO_4:Eu^{2+}$, $Mn^{2+}$, $Sr_5Si_4O_{10}Cl_6:Eu^{2+}$, $Sr_2SiO:Eu^{2+}$, $SrTiO_3:Pr^{3+}$, $SrTiO_3:Pr^{3+}$, $Al^{3+}$, $Sr_3WO_6:U$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+}$, $Mn$, $YAl_3B_4O_{12}:Ce^{3+}$, $Tb^{3+}$, $YAl_3B_4O_{12}:Eu^{3+}$, $YAl_3B_4O_{12}:Eu^{3+}$, $Cr^{3+}$, $YAl_3B_4O_{12}:Th^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3r}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+}$, $Yb^{3+}$, $YF_3:Mn^{2+}$, $YF_3:Mn^{2+}$, $Th^{4+}$, $YF_3:Tm^{3+}$, $Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBrEu^{3+}$, $Y_2O_3:Ce$, $Y_2O_3:Er^{3+}$, $Y_2O_3:Eu^{3+}(YOE)$, $Y_2O_3:Ce^{3+}$, $Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+}$, $Tb^{3+}$, $YPO_4:Eu^{3+}$, $YPO_4:Mn^{2+}$, $Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag$, $Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+}$, $Ga^{3+}$, $ZnO:Bi^{3+}$, $ZnO:Ga^{3+}$, $ZnO:Ga$, $ZnO—CdO:Ga$, $ZnO:S$, $ZnO:Se$, $ZnO:Zn$, $ZnS:Ag^+$, $Cl^-$, $ZnS:Ag$, $Cu$, $Cl$, $ZnS:Ag$, $Ni$, $ZnS:Au$, $In$, $ZnS—CdS$ (25-75), $ZnS—CdS$ (50-50), $ZnS—CdS$ (75-25), $ZnS—CdS:Ag$, $Br$, $Ni$, $ZnS—CdS:Ag^+$, $Cl$, $ZnS—CdS:Cu$, $Br$, $ZnS—CdS:Cu$, $I$, $ZnS:Cl^-$, $ZnS:Eu^{2+}$, $ZnS:Cu$, $ZnS:Cu^+$, $Al^{3+}$, $ZnS:Cu^+$, $Cl^-$, $ZnS:Cu$, $Sn$, $ZnS:Eu^{2+}$, $ZnS:Mn^{2+}$, $ZnS:Mn$, $Cu$, $ZnS:Mn^{2+}$, $Te^{2+}$, $ZnS:P$, $ZnS:P^{3-}$, $Cl^-$, $ZnS:Pb^{2+}$, $ZnS:Pb^{2+}$, $Cl^-$, $ZnS:Pb$, $Cu$, $Zn_3(PO_4)_2:Mn^{2+}$, $Zn_2SiO_4:Mn^{2+}$, $Zn_2SiO_4:Mn^{2+}$, $As^{5+}$, $Zn_2SiO_4:Mn$, $Sb_2O_2$, $Zn_2SiO_4:Mn^{2+}$, $P$, $Zn_2SiO_4:Ti^{4+}$, $ZnS:Sn^{2+}$, $ZnS:Sn$, $Ag$, $ZnS:Sn^{2+}$, $Li^+$, $ZnS:Te$, $Mn$, $ZnS—ZnTe:Mn^{2+}$, $ZnSe:Cu^+$, $Cl$, $ZnWO_4$.

In a very preferred embodiment, the inorganic photoluminescent material is a nanophosphor comprising at least one phosphor, for example the above mentioned phosphor compounds, which has a maximal diameter less than 100 nm, preferably less 50 nm, very preferably less the 30 nm, and most preferably less than 20 nm. The nanophosphor can be prepared by chemical methods such as colloidal, capping, cluster formation, sol-gel, electrochemical processes and physical methods such as molecular beam epitaxy, ionised cluster beam, liquid metal ion source, consolidation, sputtering and gas aggregation of monomers. Chemical precipitation in presence of capping agents, reaction in microemulsions, sol-gel reaction and autocombustion are preferred techniques for synthesis of nanophosphors. For more details please refer to the review paper by Harish Chander in Materials Science Engineering R 49 (2005) 113-155. Further examples of nanophosphors are $YVO_4:Bi^{3+}$, $Eu^{3+}$ by wet chemical synthesis as reported by Ogata et al., Kidorui, 54, 56-57, 2009; $Ca_{12}Al_{14}O_{33}(Ca_{12}A_{17})$ nanophosphor codoped with $Er_{3+}/Yb^{3+}$ ions through combustion route as reported by Joschi et al., J. Appl. Phys., 105, 123103-1-123103/7, 2009, $Dy^{3+}$:GAG nanophosphors synthesized by solvothermal process as reported ny Raju et al., J. Alloys Compd., 481[1-2], 730-734, 2009 and Opt. mater, 31[8], 1210-1241, 2009; Rare earth nanophosphors prepared by microwave sintering of a mixture of inorganic salt and nanophosphor precursor as disclosed in US 2009140203 and US 20090604; $Ba_{1-x}M_xAl_{12}O_{19}$:Eu (M=Ca and Sr) (x=0.1-0.5) nanophosphor synthesized by the combustion method as disclosed Deshmukh et al., J. Lumin 129[7], 691-695, 2009; Eu activated $ZnMgAl_{10}O_{17}$ nanophosphor synthesized by urea templated combustion route as disclosed Deshmukh et al., J. Alloys Compd., 475[1-2], 343-346, 2009; $Y_2O_3$:$Eu^{3+}$ nanophosphors by a modified combustion method as disclosed Ye et al., J. Appl. Phys. 105[6], 064302-1-064302/6, 2009.

In a preferred embodiment, the inorganic photoluminescent material according to the present invention is a phosphor material, which has an emission spectrum in green or yellow, and/or in wavelengths range from 500-580 nm. And further preferably, the phosphor material has a broad emission band. Such phosphor material can be selected from, for example: $Zn_2SiO_4$:Mn, ZnS:Ag+(Zn,Cd)S:Ag, ZnS:Ag+ZnS:Cu+$Y_2O_2S$:Eu, ZnO:Zn, $(KF,MgF_2)$:Mn, (Zn,Cd)S:Ag or (Zn,Cd)S:Cu, $(KF,MgF_2)$:Mn, (Zn,Cd)S:Cu, ZnS:Cu or ZnS:Cu, Ag, $MgF_2$:Mn, $(Zn,Mg)F_2$:Mn, $Zn_2SiO_4$:(Mn,As), ZnS:Ag+(Zn,Cd)S:Cu, $Gd_2O_2S$:Tb, $Y_2O_2S$:Tb, $Y_3Al_5O_{12}$:Ce, $Y_3Al_5O_{12}$:Tb, ZnS:Cu, Al or ZnS:Cu, Au, Al, (Zn,Cd)S:Cu, Cl+(Zn,Cd)S:Ag, Cl, $Y_2SiO_5$:Tb, $Y_2OS$:Tb, $Y_3(Al,Ga)_5O_{12}$:Ce, $Y_3(Al,Ga)_5O_{12}$:Tb, $InBO_3$:Tb, (Ce,Tb)$MgAl_{11}O_{19}$, $Ce_{0.67}Tb_{0.33}MgAl_{11}O_{19}$:Ce, Tb, $Zn_2SiO_4$:Mn, $Sb_2O_3$, $LaPO_4$:Ce, Tb, $(La,Ce,Tb)PO_4$, $(La,Ce,Tb)PO_4$:Ce, Tb, $Ca_3(PO_4)_2$.$CaF_2$:Ce, Mn In a further embodiment, the present invention relates also to up-converting phosphors. Such kind of phosphors are disclosed for example: a nanophosphor comprising $NaYF_4$:Yb, Ln, wherein Ln is selected from the group consisting of Er, Ho and Tm as disclosed in WO 2009/046392 and WO 2009/0409

The arrays and super-arrays according to the present invention can be used to prepare devices comprising these arrays. The present invention also relates to a device comprising at least one said array. The device can have any size. If larger panels for e.g. lighting are required, the arrays and/or super-arrays can be statistically or periodically arranged to get the required size. The panel may comprise arrays of a single type or of different types.

In a preferred embodiment the devices according to the present invention can be used in order to generate white light. Preference is given to a device which produces white light. Further preference is given for the production of white light for use in general lighting. In order to use the said device for the production of white light, a light source is required in order to excite the photoluminescent materials of the device and/or arrays according to the present invention. The present invention therefore relates to said device comprising a light source.

Light emitted by a material, composition or device can be characterized by parameters like CIE coordinates, color rendering indices (CRI) and correlated color temperature, or by spectrum specification, for example by specifying the relative emission intensities at desired wavelengths.

For general lighting, a broad band emission, e.g. a white light is desired. The white light can characterized by CIE coordinates, color rendering indices and correlated color temperature. In the study of the perception of color, different color spaces were defined, such as the first one CIE 1931 XYZ color space, and CIE 1960, CIE 1964, and CIE 1976 color spaces. In the present invention CIE 1931 will be used. In CIE 1931, the white is usually located in the center, for example (0.35, 0.34) @ 5200K, depending on the correlated temperature. The color rendering index is a quantitative measure of the ability of a light source to reproduce the colors of various objects faithfully in comparison with an ideal or natural light source. The CRIs are calculated by comparing the color rendering of the test source to that of a "perfect" source (black body radiator) for sources with correlated color temperatures less than 5000 K, and a phase of daylight otherwise for example D65—a commonly-used standard illuminant defined by the International Commission on Illumination. Depending on the test color samples, different set of CRIs can be obtained. In the present invention, R1-R14 for the special colour rendering indices using 14 CIE test colour samples and the Ra for general colour rendering index calculated from the first eight special colour rendering indices will be used. More details on the definition, measurement and calculation methods on CIE coordinets, Tc, and CRIs could be referred to "CIE (1995), Method of Measuring and Specifying Colour Rendering Properties of Light Sources, Publication 13.3, Vienna: Commission Internationale de l'Eclairage, ISBN 978-3900734572, http://www.cie.co.at/publ/abst/13-3-95.html (A verbatim re-publication of the 1974, second edition."

Given an emission spectrum, the color rendering index (CRI), CIE coordinates and correlated color temperature of can be calculated standard software well known to a person skilled in the art, e.g. by "CIE 13.3 Colour Rendering Index (1994)" by International Commission on Illumination, Copyright @ 1994 Peter Sylvester, University of Veszprem. One can get, CIE coordinates, Tc, special color rendering indices R1-R14 and the general colour rendering index Ra.

In a preferred embodiment, the array according to the present invention gives a broad emission to generate white emission in combination with an excitation light source. Generally, there are two ways to do that. In the first way (complete down-conversion hereafter), the composition absorb all light emitted from the light source, and re-emits in to a desired broad band spectrum, preferably white. The light source emits light in wavelength comprising wavelength selected from UV, deep blue to blue. In the second way (partial down-conversion), the composition only absorbs partial light from the source, and re-emits into a first broad-band spectrum, which in combination with the residual emission of the light source gives a desired broadband emission, preferably white. The light source for this case emits light in wavelength comprising wavelength selected from deep blue to blue.

The complete down-conversion and partial down-conversion can be realized by tuning the concentration and thickness of the composition in the array elements. Furthermore, the arrays may have, as outlined above a gap between the array elements, which might be transparent for blue light of the light source. In addition some of the array elements may be transparent as well. This allows tailoring the brad band spectrum of the light emitted by the arrays, super-arrays and/or devices according to the present invention very precisely.

The present invention particularly relates to arrays, super-arrays and/or devices comprising them, which gives, in combination with the source light, a high-quality white. In the first preferred embodiment the said white has a correlated color temperature ranging from 2800K to 7000K, and preferably, from 3000K to 6500K. In the second preferred embodiment, the said white gives a CIE coordinets from (0.31, 0.31) to (0.46, 0.46) in the Plankian Locus in CIE 1931 chromaticity diagram, preferably from (0.33, 0.33) to (0.45, 0.41). Planckian locus is the path or locus that the color of a black body would take in a particular chromaticity space as the black body temperature changes. In the third preferred embodiment, the said white gives a general color rendering index higher than 85, and preferably more than 90.

Light emitted by the device has been, at least in part, down-converted from a light source. This is due to the fact that white light also comprises light of longer wavelengths. The present invention also relates to said device comprising a light source which emits blue and/or ultraviolet light.

The light source can be chosen from any light source emitting light covering UV, deep blue and blue. Suitable light source can be selected from LEDs, organic electroluminescent device including organic light emitting diodes (OLEDs), polymer light emitting diodes (PLEDs), lasers, and organic light emitting electrochemical cells (OLECs or LECs). In a preferred embodiment, the light source is a LED, for example GaN-based LED, because of their high efficiency and long lifetime. In another preferred embodiment, the light source is selected from organic electroluminescent devices, which can be made flexible, in large area, and both in planar and fiber form.

Both OLEDs and OLECs, when used as light source for a device according to the present invention, offer a wide range of applications. Light sources comprising OLEDs and/or OLECs can be very thin. Furthermore, both technologies offer the possibility of producing flexible devices. Thus, devices comprising both the arrays and/or super-arrays and the light source can be made thin and flexible. Power supply may be accomplished by a thin film battery such as a printed battery offering the possibility to provide a flexible white light source of high quality for portable use. The devices according to the present inventions can be used as any white light source as required. They can be used as ceiling illumination at any place and as luminous wallpaper, to mention just a few applications.

A typical set-up of an OLED device is disclosed, e.g., in WO 2008/006449. A typical set-up of an OLEC device is disclosed, e.g., in Heeger et al., Science 1995, 269, 1086.

Based on the present invention, the white source of high quality comprising of a blue or UV light source and a layer comprising the arrays, array elements, and composition according to the present invention can be made by any method known to the skilled person.

One non-limiting example of a white source consisting of a blue organic light emitting diode (OLED) and a down-conversion layer (801) comprising a composition of the present invention is shown in FIG. 8. The OLED can be prepared on a substrate (802), such as glass or PET (polyethylene terephthalate), having an anode (803), a hole injection layer and/or a hole transport layer (804), an emissive layer (805), an electron transport layer or electron injection layer (806), a cathode (807) and an encapsulation (808). The layer (801) can be coated by for example screen printing, spin-coating etc.

Another non-limiting example of a light source emitting super-white comprises a blue OLED and a down-conversion array (901) according to the present invention as depicted in FIG. 9. The OLED can be prepared on a substrate (902), such as glass or PET, having an anode (903), a hole injection layer and/or a hole transport layer (904), an emissive layer (905), an electron transport layer or electron injection layer (906), a cathode (907) and an encapsulation (908). The array (901) can be deposited, e.g., by ink-jet printing.

The present invention also relates to a method for the generation of white light by down conversion through irradiating an array and/or super-array and/or a panel comprising multiple arrays according to the present invention with blue, deep blue and/or ultraviolet light. The arrays, materials used, and light sources required are described in detail within the present invention elsewhere.

The present invention also relates to a method for the preparation of an array according to the present invention by employing a printing technique, preferably screen printing, ink-jet printing, flexo printing, gravure printing and offset printing.

In principle, the array can be prepared by any coating technique. In a preferred embodiment, liquid coating is more desirable than other techniques. Solution deposition methods are especially preferred.

Preferred deposition techniques include, without limitation, dip coating, spin coating, ink jet printing, letter-press printing, screen printing, doctor blade coating, roller printing, reverse-roller printing, offset printing, flexographic printing, Gravure printing, web printing, spray coating, brush coating or pad printing. Screen printing, ink-jet printing, flexo printing, Gravure printing, spray coating and offset printing is particularly preferred.

To enable one printing technique, the corresponding formulations comprising a composition according to the different array element should be prepared. For that purpose the compositions required for the array elements according to the present invention may comprise at least one further solvent.

Composition comprising at least 2 quantum dots and at least one photoluminescent compound.

These compositions can be used to generate white light with high quality as outlined elsewhere within the present invention. The compositions according to the present invention can also be used in opto-electronic devices. Preferred opto-electronic devices are selected from organic light emitting diodes (OLEDs), polymer light emitting diodes (PLEDs), fiber OLEDs, organic light emitting electrochemical cells (OLECs), organic field effect transistors (OFETs), thin film transistors (TFTs), organic solar cells (O-SCs), dye-sensitised solar cells (DSSCs), organic laser diodes (G-laser), organic integrated circuits (O-IC), radio frequency identification (RFID) tags, photodetectors, sensors, logic circuits, memory elements, capacitors, charge injection layers, Schottky diodes, planarising layers, antistatic films, conducting substrates or patterns, photoconductors, electrophotographic elements, organic light emitting transistors (OLETs), organic spintronic devices, and organic plasmon emitting devices (OPEDs The compositions according to the present invention preferably comprise the quantum dot(s) each in a concentration of at least 0.1 wt %, particularly preferably at least 0.5 wt %, and very particularly preferably of at least 3 wt % with respect to the total amount of the composition.

The compositions according to the present invention preferably comprise the photoluminescent compound(s) in a concentration of at least 0.1 wt %, particularly preferably at least 0.5 wt %, and very particularly preferably of at least 3 wt % with respect to the total amount of the composition.

Composition according to claim 18, characterized in that the photoluminescent compound is selected from organic fluorescent compounds, organic phosphorescent compounds, and inorganic phosphors.

Composition according to claim 18 or 19, characterized in that the composition comprises at least one further organic functional material selected from host materials, hole transport materials (HTMs), hole injection materials (HIMs), hole blocking materials (HBMs), electron transport materials (ETMs), electron injection materials (EIMs), electron blocking materials (EBMs) and emitter materials, which can be chosen from small organic molecules, a conjugated polymers, non-conjugated polymers, oligomers, and dendrimers.

The further organic functional materials according to the present invention are the materials which are commonly used in the field of organic electronics and which are well known to one skilled in the art. A preferred compilation of further organic functional materials is disclosed in EP 09015222.4 and EP 10002558.4.

The compositions according to the present invention preferably comprise the further organic functional material(s) in a concentration of at least 0.01 wt %, particularly preferably at least 0.1 wt %, and very particularly preferably of at least 1 wt % with respect to the total amount of the composition.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the embodiments, are inventive in their own right and not just as part of an embodiment of the present invention. Independent protection may be sought for these features in addition to or alternative to any invention presently claimed.

The teaching as disclosed here can be abstracted and combined with other examples disclosed.

Other features of the invention will become apparent in the course of the drawings and following description of exemplary embodiments, which are given for illustration of the invention and are not intended to be limiting thereof.

Some of the above mentioned embodiments will be described in more detail in the following working examples with reference to the accompanying drawings.

WORKING EXAMPLES

Example 1

Materials

The following materials can be used in the present invention as examples.

Figure 1:
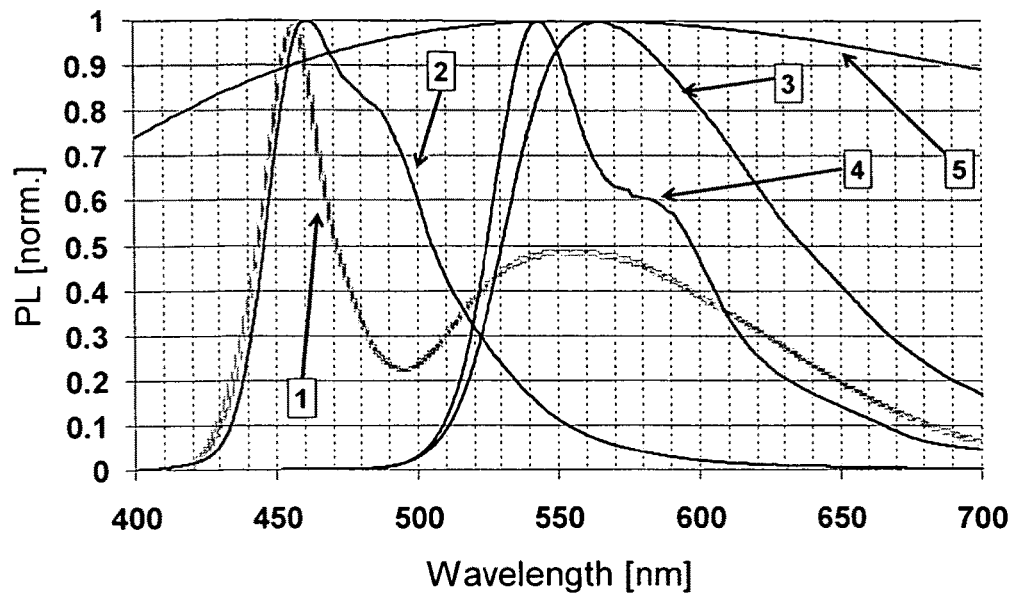
FIG. 1: Normalized photoluminescence spectrum of 1. YAG: Ce, 2. SEB-095, 3. PDY-132, 4. PDO-123, 5. black body at T=5200 K.

Yellow emissive polymer PDY-132 (Merck KGaA) and orange emissive polymer PDO-123 (Merck KGaA) are used as organic photoluminescent materials. PDY-132 and PDO-123 are efficient polymeric fluorescent materials, having broad emission from 500 to 700 nm. Both are well soluble in common organic solvent, for example toluene, and show good film formation if coated from solution. In FIG. 1 the photoluminescence (PL) spectrum of thin films of PDY-132 (curve 3) and PDO-123 (curve 4) are shown in FIG. 1, in comparison with a white spectrum using a blue LED and phosphor YAG:Ce (curve 1) as down-converter. Here, the spectrum of PDY-132 shows the highest similarity with the spectrum of YAG:Ce. Curve 5 in FIG. 1 depicts the black body radiation at 5200 K. Further SEB-095 (Merck KGaA) is used as blue organic fluorescent material. The PL spectrum of SEB-095 is also shown in as curve 2 in FIG. 1.

Figure 2:
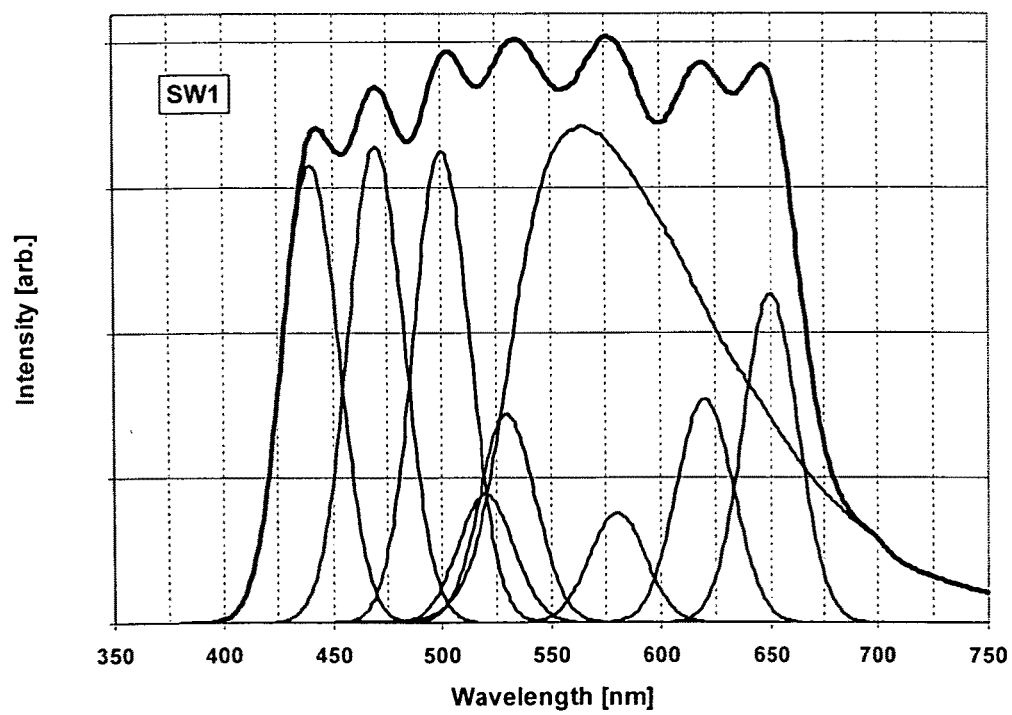
FIG. 2: Emission spectrum of super white 1 (SW1)

The following 8 quantum dots with core-shell structure are selected in combination with PDY-132 or PDO-123 in order to get a super white light. All quantum dots have PL spectrum of a (quasi-)Gaussian form if excited at 380 nm with a full width at half maximum (FWHM) of about 30 nm. The photoluminescent spectrums of the QDs are shown in FIG. 2 and the maximum wavelengths of QD1 to QD8 are as follows:

| | Quantum Dot | | | | | | | |
|---|---|---|---|---|---|---|---|---|
| | QD1 | QD2 | QD3 | QD4 | QD5 | QD6 | QD7 | QD8 |
| Max. wavelength [nm]* | 440 | 470 | 500 | 520 | 530 | 580 | 620 | 650 |

*all fluorescence maximum range in +/−5 nm

QD1 to QD8 are core-shell type quantum-dots by Plasmachem GmbH, Berlin, Germany. QD1 to QD4 have a ZnCdSe spheric core capped with epitaxial ZnS shell. QD5 to QD8 have a CdSe spheric core capped with epitaxial ZnS shell. All QDs have a surface hydrophobic layer comprising mostly trioctylphosphine oxide. The different emission spectrums are realized by tuning the size of the core, for example QD5 has a core of 2.5 nm in diameter, whereas QD6 of 3.6 nm.

Example 2

Super White1 (SW1)

SW1 is prepared using a mixture of PDY-132 and QDs as down converter for a blue LED or UV light source.

By using a thick enough layer comprising the mixture of the following composition, all blue light from the blue LED light source is absorbed. The mixture of following composition gives a broad emission spectrum as shown in FIG. 2.

TABLE 1

Composition of the mixture for SW1. Concentration (conc.) is given in wt %

| | QD1 | QD2 | QD3 | QD4 | QD5 | QD6 | QD7 | QD8 | PDY-132 |
|---|---|---|---|---|---|---|---|---|---|
| Conc. | 15.7 | 16.4 | 16.3 | 4.5 | 7.2 | 3.8 | 7.7 | 11.3 | 17.1 |

The color rendering index (CRI), CIE coordinates and correlated color temperature of SW1 is calculated by employing the software "CIE 13.3 Colour Rendering Index (1994)" by International Commission on Illumination, Copyright @ 1994 Peter Sylvester, University of Veszprem. The results are summarized in Table, wherein Tc stands for correlated colour temperature, R1-R14 for the special colour rendering indices using 14 CIE test colour samples and the Ra for general colour rendering index calculated from the first eight special colour rendering indices. For more details please refer to "CIE (1995), Method of Measuring and Specifying Colour Rendering Properties of Light Sources, Publication 13.3, Vienna: Commission Internationale de l'Eclairage, ISBN 978-3900734572, http://www.cie.co.at/publ/abst/13-3-95.html (A verbatim re-publication of the 1974, second edition". As can be seen in Table 2, SW1 is a high quality white, having a general CRI as high as 96.

TABLE 2

CRI, CIE coordinates and color temperature of different whites

| | SW1 | SW2 | SW3 | SW3-Ref |
|---|---|---|---|---|
| CIEx | 0.34 | 0.34 | 0.36 | 0.34 |
| CIEy | 0.36 | 0.36 | 0.40 | 0.38 |
| Tc [K] | 5108 | 5225 | 4638 | 5154 |
| R1 | 95.8 | 98.4 | 91.9 | 70.1 |
| R2 | 98.2 | 99.5 | 95.6 | 88.7 |
| R3 | 98.9 | 99.2 | 90.9 | 91.2 |
| R4 | 95.8 | 98.0 | 83.4 | 61.8 |
| R5 | 96.3 | 98.7 | 90.6 | 70.2 |
| R6 | 98.4 | 98.4 | 98.1 | 83.1 |
| R7 | 96.8 | 97.5 | 87.2 | 79.9 |
| R8 | 92.6 | 96.3 | 83.0 | 53.5 |
| R9 | 80.5 | 91.3 | 66.3 | −23.9 |
| R10 | 96.7 | 99.1 | 92.8 | 72.6 |
| R11 | 97.2 | 99.3 | 86.8 | 55.0 |
| R12 | 93.9 | 95.9 | 78.5 | 55.8 |
| R13 | 96.4 | 99.0 | 92.9 | 75.2 |
| R14 | 99.4 | 99.4 | 94.5 | 94.3 |
| Ra | 96.6 | 98.3 | 90.1 | 74.8 |

The solution of the mixture in toluene is used for coating a thin layer.

Example 3

Super White 2 (SW2)

SW2 is prepared using a mixture of PDO-123 and QDs as down convert for a blue LED or UV light source.

Figure 3:
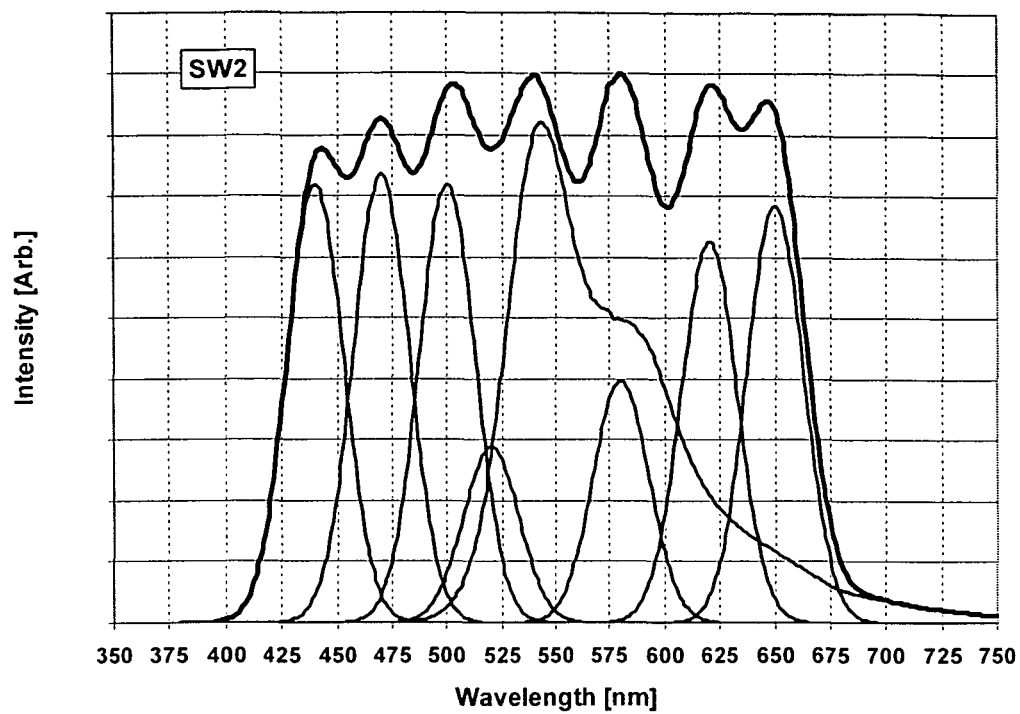
FIG. 3: Emission spectrum of super white 2 (SW2)

By using a thick enough layer comprising the mixture of the following composition, all blue light from the blue LED is absorbed. The mixture of following composition gives a broad emission spectrum as shown in FIG. 3.

TABLE 3

Composition of the mixture for SW2. Concentration (conc.) is given in wt %

| | QD1 | QD2 | QD3 | QD4 | QD6 | QD7 | QD8 | PDO-123 |
|---|---|---|---|---|---|---|---|---|
| Conc. | 14.4 | 14.7 | 14.4 | 5.8 | 8.0 | 12.5 | 13.7 | 16.5 |

The CRI, CIE coordinates and Tc of SW2 are calculated by software "CIE 13.3 Colour Rendering Index (1994)" and summarized in Table. Again, using PDO-123 in combination with quantum dots, an excellent white with a Ra as high as 98 can be achieved.

The solution of the mixture in toluene is used for coating a thin layer.

Example 4

Super White 3 (SW3)

SW3 is prepared using a mixture of PDY-132, SEB-095 and QDs as down converter for a blue LED or UV light source.

In this example, it will be shown that two organic fluorescent materials SEB-095 and PDY-132, in combination with quantum dots can be used to build a down converter with high quality white emission. An example (SW3) is given by using the mixture of the composition given in Table 4.

TABLE 4

Composition of the mixture for SW2. Concentration (conc.) is given in wt %

| | QD3 | QD4 | QD6 | QD7 | QD8 | SEB-095 | PDY-132 |
|---|---|---|---|---|---|---|---|
| Conc. | 7.81 | 11.84 | 4.79 | 11.34 | 15.87 | 25.19 | 23.16 |

Figure 4:
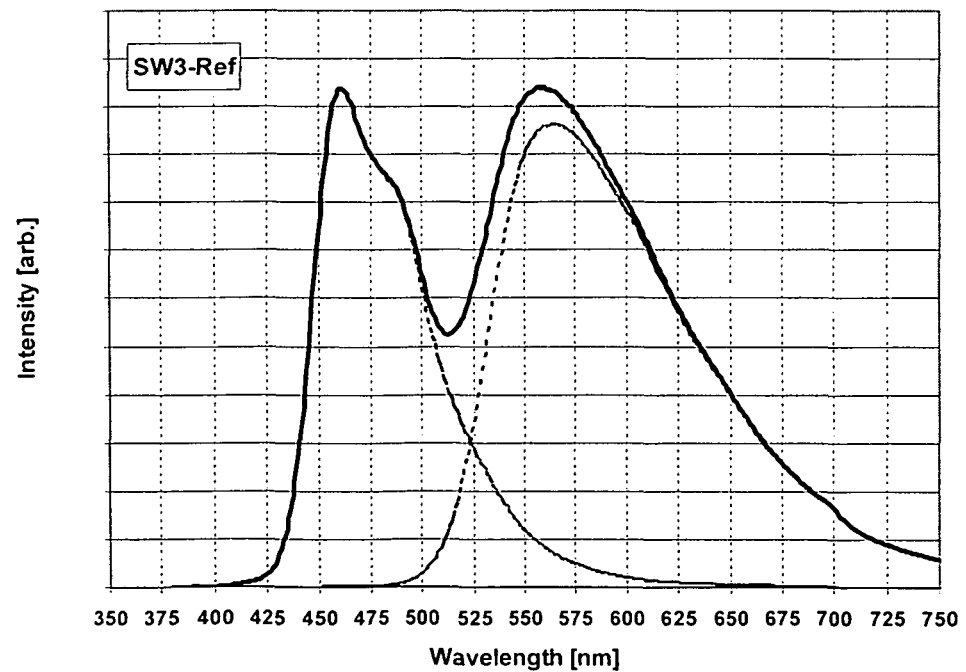
FIG. 4: Emission spectrum of SW3-Ref, a superposition of SEB-095 and PDY-132.
Figure 5:
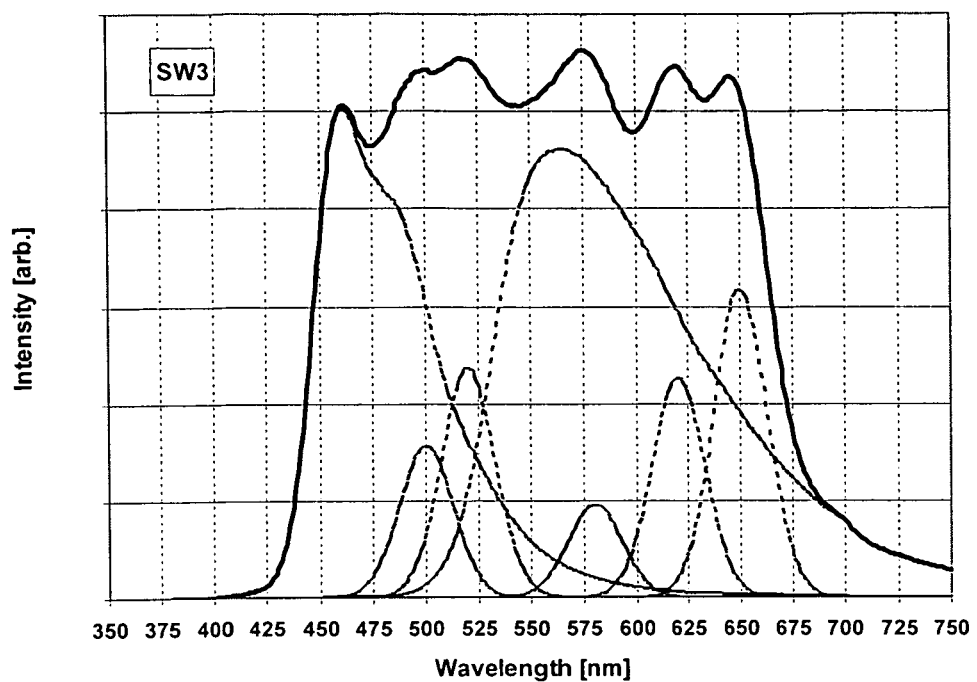
FIG. 5: Emission spectrum of super white 3 (SW3).

Additionally, a two color white (SW3-Ref) consisting of only SEB-095 and PDY-132 is compared to SW3. The ratio of SEB-095 and PDY-132 are the same in SW3 and SW3-Ref. The spectrum of SW3 and SW3-Ref are shown in FIG. 5 and FIG. 4, respectively. The results are also shown in Table 2.

The solution of the mixture in toluene is used for coating a thin layer.

Example 5

Super White 4 (SW4)

SW4 is prepared using a mixture of PDY-132 and QDs as down converter for OLED.

Using the mixture of Example 4 without SEB-095, but keeping the same ratio of others, a down-converter using the following OLED as blue light source can be achieved, which gives a white which is comparable to the white obtained with SW3.

The OLED has a device structure of glass/ITO(150 nm)/PEDOT(20 nm)-/HTM-014(30 nm)/NPB(20 nm)/SEB1(95%): SEB-095(5%)(30 nm)-/Alq₃(20 nm)/LiF(1 nm/Al (100 nm), wherein PEDOT (Baytron P Al 4083) is a buffer layer, HTM-014 a hole injection or transport material by Merck KGaA, NPB is N,N'-Di(naphthalen-1-yl)-N,N'-diphenyl-benzidine, and SEB1 is a host material having a structure as follows:

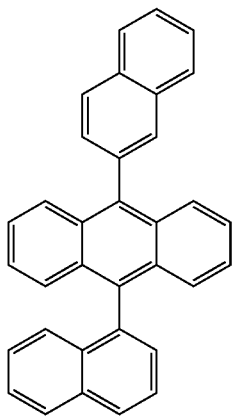 [SMILES: c1ccc2cc(-c3c4ccccc4c(-c4cccc5ccccc45)c4ccccc34)ccc2c1]

The PEDOT is coated by spin-coating and other layers are prepared by vacuum thermal evaporation, and finally encapsulated. More details on the preparation of OLEDs are disclosed in WO 2008/006449 A1.

The electroluminescence spectrum of the OLED is comparable to the PL spectrum of SEB-095. The mentioned mixture without SEB-095 is coated on the top of the glass substrate of the OLED. The layer is thin enough to let the emission of the OLED partially though. By adjusting the thickness of the converter layer, a white spectrum comparable to the one of SW3 can be obtained.

Such kind of converter can also be integrated in the OLED device, the so-called internal conversion, as disclosed in DE 102010006280.4.

Example 6

Arrays with Different Domains (Array Elements)

An stand alone conversion layer can be prepared by depositing the quantum dots and photoluminescent materials in different domains (array elements) of an array on a transparent substrate.

Figure 6:
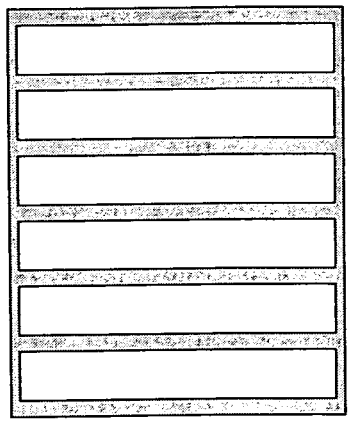
FIG. 6: a) exemplary array with 10 columns and 10 rows comprising 9 different compositions (array elements) in a periodic arrangement; b) array with 6 rows and 1 column; c) array with 5 rows and 8 columns with hexagonal array elements.
Figure 6:
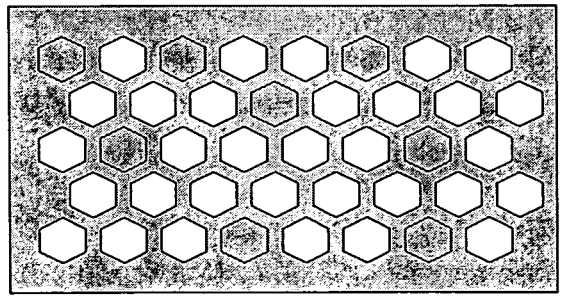

The first example is shown in FIG. 6, wherein different pixels are defined on the substrate, and filled by the different components (9 components as shown in Example 2. By adjusting the pixel numbers for the different components, super white as SW1 to SW3 can be obtained. To let the light from a blue light source at least partially through, blank pixel can be used together with other pixels comprising either quantum dots or photoluminescent organic compounds or both. Blank pixel means here either an empty pixel or a pixel filled with binder, which is transparent to light of the light source and which emits no light.

Figure 7:
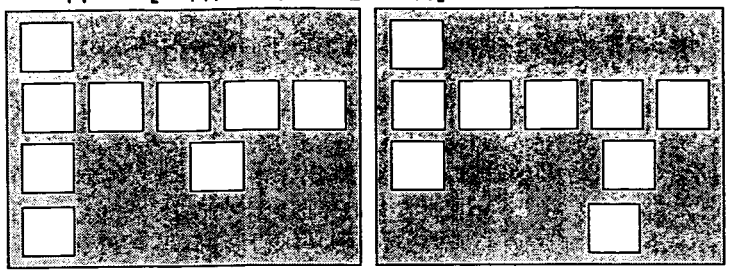
FIG. 7: Super array $\Lambda_{41}$ (a) and $\Lambda_{22}$ (b).
Figure 7:
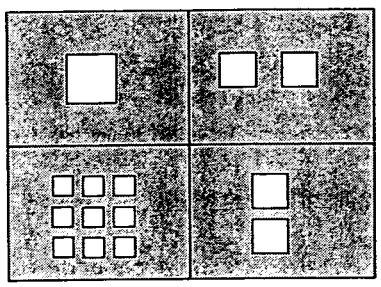
Figure 8:
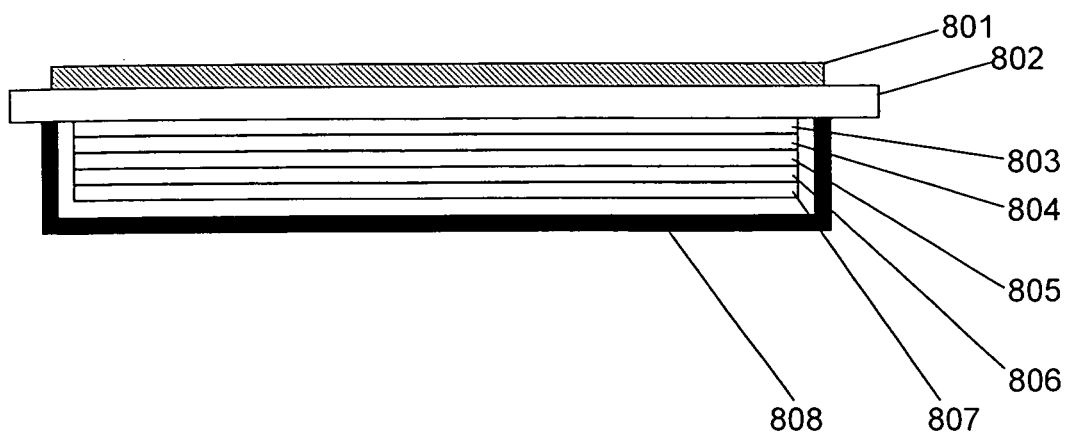
FIG. 8: Device emitting white light comprising a blue organic light emitting diode (OLED) and a down-conversion layer (801) comprising a composition of the present invention, a substrate (802), such as glass or PET (polyethylene terephthalate), having an anode (803), a hole injection layer and/or a hole transport layer (804), an emissive layer (805), an electron transport layer or electron injection layer (806), a cathode (807) and an encapsulation (808).
Figure 9:
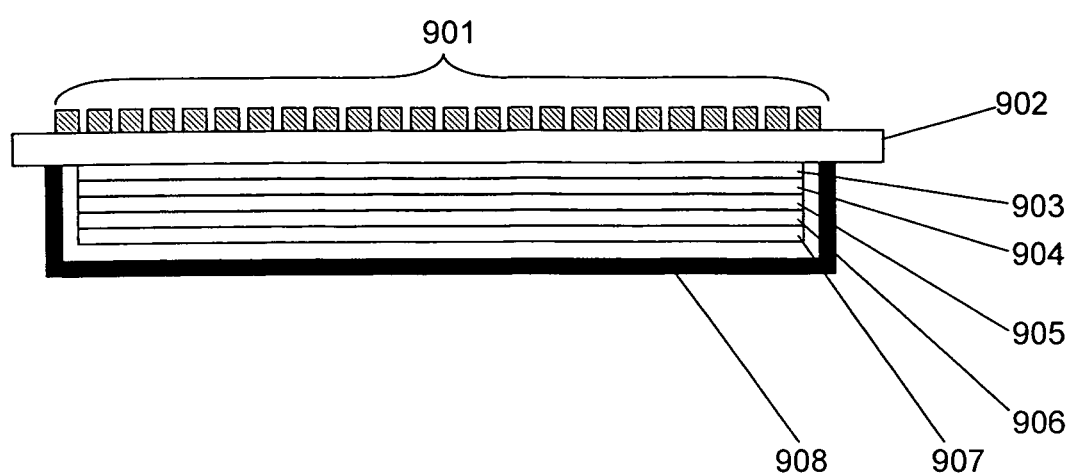
FIG. 9: Device emitting white light comprising a blue OLED and a down-conversion array (901), a substrate (902), such as glass or PET, having an anode (903), a hole injection layer and/or a hole transport layer (904), an emissive layer (905), an electron transport layer or electron injection layer (906), a cathode (907) and an encapsulation (908).

The second example is illustrated in FIG. 7, wherein different stripes (array elements or domains) are defined on the substrate, and filled by the different components (9 components as shown in Example 2. By adjusting the number of stripes or the width of the stripes for the different components, the white as SW1-3 can be obtained. To let the light from blue source partially through, blank stripes can be used together with other stripes. Blank stripes means here either an empty stripe or a stripe filled with binder, which is transparent to source light and emits no light.

The invention claimed is:

1. An array $A_{ij}$ comprising i times j array elements $a_{ij}$, wherein said array $A_{ij}$ comprises at least one composition comprising at least five different types of quantum dots being localized in an array element $a_{ij}$, wherein i is a row index and j is a column index, and wherein i=j=1, and the at least one composition comprised by the array comprises at least one further photoluminescent compound, wherein the photoluminescent compound is a phosphorescent emissive polymer, wherein the emissive polymer is a conjugated, a non-conjugated or partially-conjugated polymer comprising a backbone unit comprising fluorene, phenanthrene, dehydrophenanthrene, or indenofluorene derivatives selected from formulae (29) to (40):

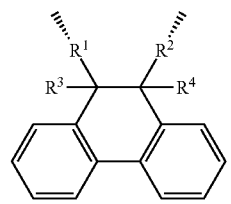

Formula (29)

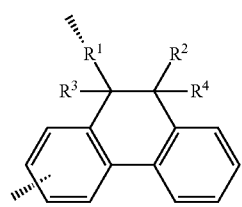

Formula (30)

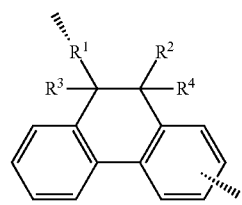

Formula (31)

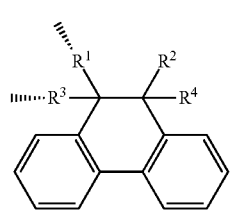

Formula (32)

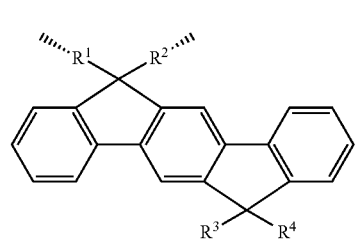

Formula (33)

-continued

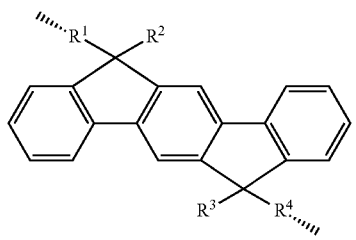
Formula (34)

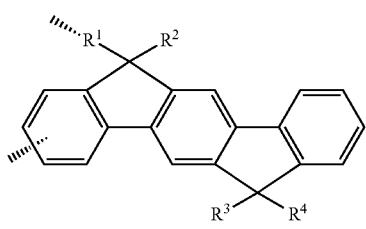
Formula (35)

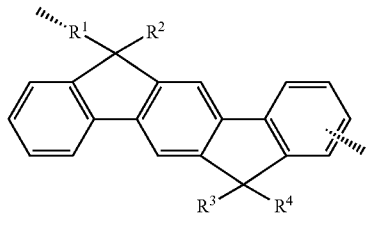
Formula (36)

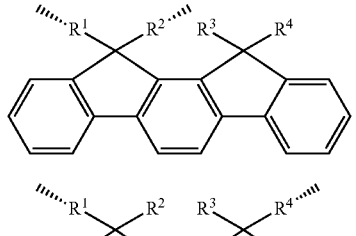
Formula (36)

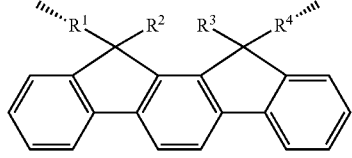
Formula (38)

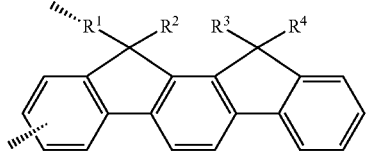
Formula (39)

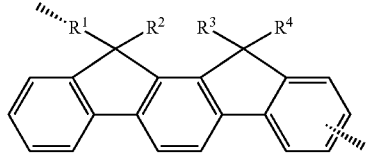
Formula (40)

wherein R1 to R4 are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

2. The array of claim 1, wherein at least one quantum dot has an emission intensity maximum in the range between 380 and 700 nm.

3. The array of claim 1, wherein said different types of quantum dots differ in their emission intensity maxima.

4. The array of claim 1, wherein at least one quantum dot is selected from Group II-VI, Group III-V, Group IV-VI and Group IV semiconductors.

5. The array of claim 4, wherein said quantum dot is selected from the group consisting of ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, and a combination thereof.

6. The array of claim 1, wherein said at least one photoluminescent compound has a broadband spectrum.

7. The array of claim 1, wherein said array further comprises at least one binder material and/or at least one organic dye.

8. The array of claim 7, wherein said at least one binder material and/or said at least one organic dye is an emitter selected from an inorganic phosphor.

9. A device comprising at least one array of claim 1.

10. The device of claim 9, wherein said device comprises a light source.

11. The device of claim 10, wherein said light source emits blue and/or ultraviolet light.

12. The device of claim 10, wherein said light source is a light emitting diode, organic light emitting diode, polymer light emitting diode, organic light emitting electrochemical cell, laser, or UV lamp.

13. A method for the generation of white light by down conversion through irradiating the array of claim 1 with blue or ultraviolet light.

14. A method for the preparation of the array of claim 1, said method comprising employing a printing technique.

15. The method of claim 14, wherein said printing technique is screen printing, ink-jet printing, flexo printing, gravure printing, or offset printing.

16. A composition comprising at least five different types of quantum dots and at least one photoluminescent compound, wherein the photoluminescent compound is a phosphorescent emissive polymer, wherein the emissive polymer is a conjugated, a non-conjugated or partially-conjugated polymer comprising a backbone unit comprising fluorene, phenanthrene, dehydrophenanthrene, or indenofluorene derivatives selected from formulae (29) to (40):

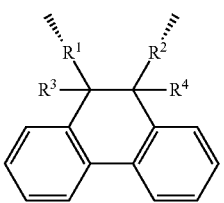
Formula (29)

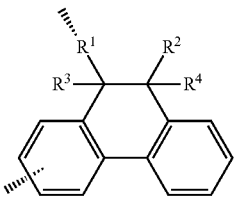
Formula (30)

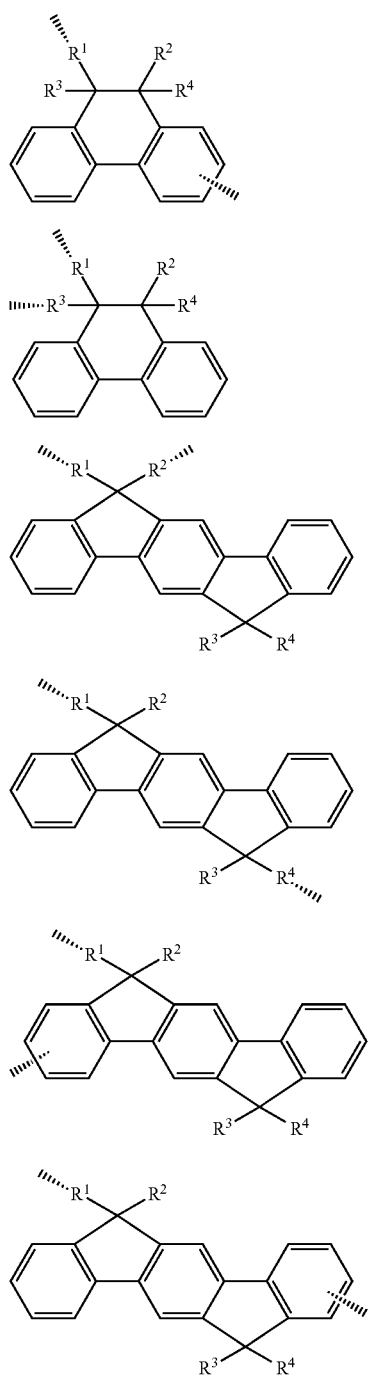

Formula (31)

Formula (32)

Formula (33)

Formula (34)

Formula (35)

Formula (36)

Formula (36)

Formula (38)

Formula (39)

Formula (40)

wherein R1 to R4 are independently from each other selected from H, F, an alkyl group with 1 to 40 C-atoms, an alkenyl group with 2 to 40 C-atoms, an alkinyl group with 2 to 40 C-atoms, a substituted or unsubstituted aryl group with 6 to 40 C-atoms, and a substituted or unsubstituted heteroaryl group, wherein the heteroaryl group has 5 to 25 ring members.

17. The composition of claim 16, wherein said photoluminescent compound is an organic phosphorescent compound and wherein the composition further comprises at least one inorganic photoluminescent material.

18. The composition of claim 16 further comprising at least one organic functional material selected from a host material, hole transport material, hole injection material, hole blocking material, electron transport material, electron injection material, electron blocking material, and emitter material, wherein said at least one organic functional material is selected from the group consisting of small organic molecules, conjugated polymers, non-conjugated polymers, oligomers, and dendrimers.

* * * * *